(12) United States Patent
Jeon

(10) Patent No.: US 10,937,466 B2
(45) Date of Patent: Mar. 2, 2021

(54) SEMICONDUCTOR PACKAGE WITH CLOCK SHARING AND ELECTRONIC SYSTEM INCLUDING THE SAME

(71) Applicant: Samsung Electronics Co., Ltd., Suwon-si (KR)

(72) Inventor: Seong-hwan Jeon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/880,506

(22) Filed: May 21, 2020

(65) Prior Publication Data

US 2020/0286531 A1  Sep. 10, 2020

Related U.S. Application Data

(63) Continuation of application No. 16/053,129, filed on Aug. 2, 2018, now Pat. No. 10,714,149.

(30) Foreign Application Priority Data

Jan. 17, 2018 (KR) .................. 10-2018-0006266

(51) Int. Cl.
*G11C 5/06* (2006.01)
*H01L 25/10* (2006.01)
(Continued)

(52) U.S. Cl.
CPC ............ *G11C 5/063* (2013.01); *G06F 3/0604* (2013.01); *G06F 3/0659* (2013.01);
(Continued)

(58) Field of Classification Search
CPC ......... G11C 5/063; G11C 5/04; G11C 7/1093; G11C 7/225; G06F 3/0604; G06F 3/0659;
(Continued)

(56) References Cited

U.S. PATENT DOCUMENTS 6,618,320 B2   9/2003  Hasegawa et al.
7,515,451 B2   4/2009  Djordjevic
(Continued)

FOREIGN PATENT DOCUMENTS

TW      200907380 A      2/2009

OTHER PUBLICATIONS

European Search Report dated Jul. 18, 2019 issued in corresponding European Application No. 19153502.0.

*Primary Examiner* — Connie C Yoha

(74) *Attorney, Agent, or Firm* — Harness, Dickey & Pierce, P.L.C.

(57) ABSTRACT

A semiconductor package with clock sharing, which is suitable for an electronic system having low power consumption characteristics, is provided. The semiconductor package includes a lower package including a lower package substrate and a memory controller mounted on the lower package substrate, an upper package stacked on the lower package and including an upper package substrate and a memory device mounted on the upper package substrate, and a plurality of vertical interconnections electrically connecting the lower package to the upper package. The semiconductor package is configured to cause the memory controller to output a first data clock signal used for a channel that is an independent data interface between the memory controller and the memory device, branch the first data clock signal, and provide the branched first data clock signal to the memory device.

20 Claims, 15 Drawing Sheets

(51) Int. Cl.
*G06F 13/16* (2006.01)
*G06F 3/06* (2006.01)
*H01L 25/18* (2006.01)
*G11C 7/22* (2006.01)
*G11C 5/04* (2006.01)
*G11C 7/10* (2006.01)

(52) U.S. Cl.
CPC ........ *G06F 3/0673* (2013.01); *G06F 13/1689* (2013.01); *G11C 5/04* (2013.01); *G11C 7/1093* (2013.01); *G11C 7/225* (2013.01); *H01L 25/105* (2013.01); *H01L 25/18* (2013.01); *H01L 2225/1035* (2013.01); *H01L 2225/1041* (2013.01); *H01L 2225/1058* (2013.01)

(58) Field of Classification Search
CPC . G06F 3/0673; G06F 3/1689; H01L 125/105; H01L 125/18; H01L 2225/1035; H01L 2225/1041; H01L 2225/1058
USPC ............ 365/233.13, 63, 185.27, 61
See application file for complete search history.

(56) References Cited

U.S. PATENT DOCUMENTS

| | | | |
|---|---|---|---|
| 7,814,239 B2 | 10/2010 | Kim et al. | |
| 7,826,303 B2* | 11/2010 | Ko | G11C 7/1039 365/189.05 |
| 7,882,282 B2* | 2/2011 | Haban | G06F 13/4282 348/725 |
| 8,812,892 B1 | 8/2014 | Hill et al. | |
| 2007/0019494 A1 | 1/2007 | Moosrainer et al. | |
| 2008/0211078 A1 | 9/2008 | Kwon et al. | |
| 2009/0039492 A1 | 2/2009 | Kang et al. | |
| 2009/0207895 A1* | 8/2009 | Park | G11C 29/1201 375/219 |
| 2011/0055617 A1 | 3/2011 | Sankuratri et al. | |
| 2013/0326188 A1 | 12/2013 | Suh et al. | |
| 2014/0327129 A1 | 11/2014 | Cho et al. | |
| 2015/0008580 A1 | 1/2015 | Joh | |
| 2015/0130041 A1 | 5/2015 | Seo et al. | |
| 2015/0194197 A1 | 7/2015 | West et al. | |
| 2017/0004869 A1 | 1/2017 | Shin et al. | |
| 2017/0213776 A1 | 7/2017 | Oikawa et al. | |
| 2018/0005686 A1* | 1/2018 | Oh | G11C 7/1066 |
| 2019/0172512 A1 | 6/2019 | Oh et al. | |

* cited by examiner

SEMICONDUCTOR PACKAGE WITH CLOCK SHARING AND ELECTRONIC SYSTEM INCLUDING THE SAME

CROSS-REFERENCE TO RELATED APPLICATION

This application is a continuation of U.S. application Ser. No. 16/053,129, filed on Aug. 2, 2018, which claims priority under 35 U.S.C. § 119 to Korean Patent Application No. 10-2018-0006266, filed on Jan. 17, 2018, in the Korean Intellectual Property Office, the disclosure of each of which is incorporated herein in its entirety by reference.

BACKGROUND

The inventive concepts relate to semiconductor packages, and more particularly to semiconductor packages suitable for an electronic system having low power consumption characteristics.

A mobile-oriented semiconductor memory device, such as low power double data rate (LPDDR) synchronous dynamic random access memory (SDRAM), is mainly used in mobile electronic devices (e.g., smart phones, tablet PCs, and/or ultra books). As the capacity of a mobile operating system (OS) increases to support multitasking on mobile electronic devices, mobile electronic devices having low power consumption characteristics and high operation performance are desired.

When an application processor (AP) is mounted on a mobile electronic device as one of the multi-cores, a semiconductor memory device such as LPDDR SDRAM may be used as a working memory for the AP. The LPDDR SDRAM may receive a system clock signal and data clock signals provided from the AP in a write operation mode or a read operation mode. The system clock signal is a clock signal related to a transmission rate of a command or an address applied to perform a data input/output operation, and the data clock signals are clock signals related to input/output rates of a plurality of pieces of data. The data clock signals may be faster than the system clock signal.

SUMMARY

The inventive concepts provide semiconductor packages suitable for an electronic system having low power consumption characteristics.

According to an aspect of the inventive concepts, a semiconductor package includes a lower package including a lower package substrate and a memory controller on the lower package substrate, an upper package stacked on the lower package and including an upper package substrate and a memory device on the upper package substrate, and a plurality of vertical interconnections electrically connecting the lower package to the upper package. The semiconductor package is configured to cause the memory controller to output a first data clock signal used for a channel that is an independent data interface between the memory controller and the memory device, branch the first data clock signal, and provide the branched first data clock signal to the memory device.

According to another aspect of the inventive concepts, a semiconductor package includes a lower package including a lower package substrate and a memory controller in the lower package substrate, an upper package including an upper package substrate and a memory device on the upper package substrate, and an upper redistribution interposer adjacent to an upper surface of the lower package and electrically connecting connection terminals of the memory controller to connection terminals of the memory device. The semiconductor package is configured to cause the memory controller to output a first data clock signal used for a channel that is an independent data interface between the memory controller and the memory device, branch the first data clock signal, and provide the branched first data clock signal to the memory device.

According to another aspect of the inventive concepts, a semiconductor package includes an interposer, a memory controller on the interposer, and a memory device on the interposer in a direction parallel to the memory controller. The semiconductor package is configured to cause the memory controller to output a first data clock signal used for a channel that is an independent data interface between the memory controller and the memory device, branch the first data clock signal, and provide the branched first data clock signal to the memory device.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
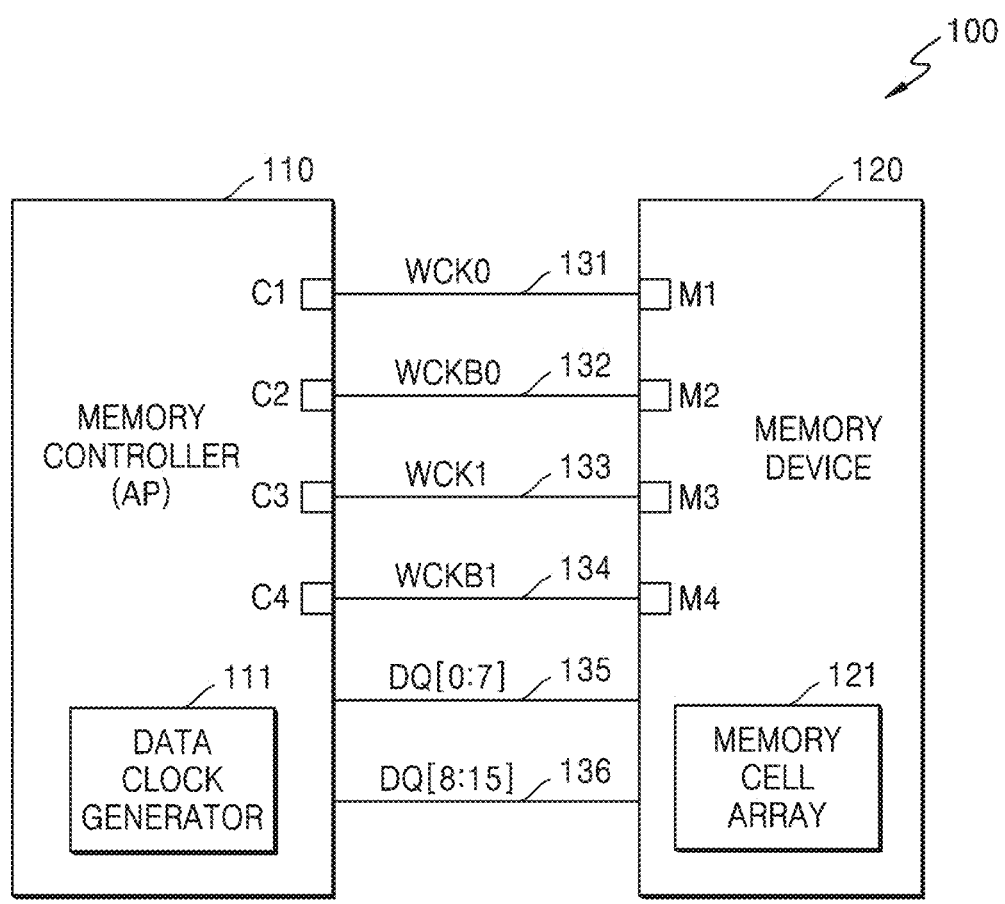
FIG. 1 is a block diagram of a memory system according to an example embodiment of the inventive concepts.

FIG. 1 is a block diagram of a memory system 100 according to an example embodiment of the inventive concepts.

Referring to FIG. 1, the memory system 100 may include a memory controller 110 and a memory device 120. The memory system 100 may be embodied in a personal computer (PC) or a mobile electronic device. The mobile electronic device may be, for example, a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) Device, an internet of everything (IoE) device, or a drone.

The memory controller 110 may be implemented with, for example, an integrated circuit (IC), a system on chip (SoC), an application processor (AP), a mobile AP, a chipset, or a set of chips. In some example embodiments, the memory controller 110 may include random access memory (RAM), a central processing unit (CPU), a graphics processing unit (GPU), and/or a modem. In some example embodiments, the memory controller 110 may perform functions of the modem and the AP.

The memory device 120 may be implemented with, for example, a volatile memory device. The volatile memory device may be implemented with RAM, dynamic RAM (DRAM), or static RAM (SRAM), but is not limited thereto. As an example, the memory device 120 may be implemented with wide input/output (I/O) DRAM, low power double data rate (LPDDR) DRAM, or the like.

The volatile memory device loses stored data when a power supply is interrupted. In contrast, a non-volatile memory device, such as magnetic random access memory (MRAM), may retain stored data even after a power supply is interrupted. Therefore, in order to prevent data loss due to a power failure or a power cutoff, the nonvolatile memory device may be used. For example, in the case where spin transfer torque MRAM (STT-MRAM) constitutes a memory device, such a memory device may have nonvolatile properties as well as a relatively fast response time. An STT-MRAM cell may include a magnetic tunnel junction (MTJ) element and a selection transistor. The MTJ element may basically include two magnetic layers (e.g., a fixed layer and a free layer) and a tunnel layer between the magnetic layers. A magnetization direction of the fixed layer may be fixed, and a magnetization direction of the free layer may be the same as or opposite to the magnetization direction of the fixed layer depending on conditions.

According to an example embodiment, the memory device 120 may be implemented with a non-volatile memory device. As an example, the memory device 120 may be electrically erasable programmable read-only memory (EEPROM), a flash memory, MRAM, STT-MRAM, ferroelectric RAM (FeRAM), phase change RAM (PRAM), resistive RAM (RRAM), nanotube RRAM, polymer RAM (PoRAM), a nano floating gate memory (NFGM), a holographic memory, a molecular electronic memory device, an insulator resistance change memory, or the like.

The memory controller 110 may control the memory device 120 to read data stored in the memory device 120 or to write data to the memory device 120. The memory controller 110 may control a write operation or a read operation on the memory device 120 by providing a command and an address to the memory device 120. Furthermore, data for the write operation and read data may be transmitted and received between the memory controller 110 and the memory device 120.

The memory controller 110 may include a data clock generator 111 for generating a plurality of data clock signal pairs, i.e., a first data clock signal pair WCK0 and WCKB0 and a second data clock signal pair WCK1 and WCKB1, for controlling data input/output, and may apply the first data clock signal pair WCK0 and WCKB0 and the second data clock signal pair WCK1 and WCKB1, generated by the data clock generator 111, to the memory device 120 through first to fourth signal lines 131 to 134. The first data clock signal pair WCK0 and WCKB0 may be configured in the form of differential signals having complementary phases, and the second data clock signal pair WCK1 and WCKB1 may also be configured in the form of differential signals having complementary phases.

The memory controller 110 may transmit the first data clock signal pair WCK0 and WCKB0 to the first and second signal lines 131 and 132 through first and second ports C1 and C2. The memory device 120 may receive the first data clock signal pair WCK0 and WCKB0, transmitted to the first and second signal lines 131 and 132, through first and second ports M1 and M2. The memory device 120 may receive a first data group DQ[0:7], synchronized with the first data clock signal pair WCK0 and WCKB0, from the memory controller 110 through a first data bus 135. The memory device 120 may store the received first data group DQ[0:7] in memory cells of a memory cell array 121 at the operating speed of the first data clock signal pair WCK0 and WCKB0.

The memory controller 110 may transmit the second data clock signal pair WCK1 and WCKB1 to the third and fourth signal lines 133 and 134 through third and fourth ports C3 and C4. The memory device 120 may receive the second data clock signal pair WCK1 and WCKB1, transmitted to the third and fourth signal lines 133 and 134, through third and fourth ports M3 and M4. The memory device 120 may receive a second data group DQ[8:15], synchronized with the second data clock signal pair WCK1 and WCKB1, from the memory controller 110 through a second data bus 136. The memory device 120 may store the received second data group DQ[8:15] in memory cells of the memory cell array 121 at the operating speed of the second data clock signal pair WCK1 and WCKB1.

Although an example in which the first data clock signal pair WCK0 and WCKB0 and the second data clock signal pair WCK1 and WCKB1 control the input and output of data in units of bytes including the first data group DQ[0:7] and the second data group DQ[8:15] has been described, the inventive concepts are not limited thereto. The first data group DQ[0:7] and the second data group DQ[8:15] may constitute one channel in terms of a data interface between the memory controller 110 and the memory device 120. The channel may refer to an independent data interface. Although an example in which the first data clock signal pair WCK0 and WCKB0 and the second data clock signal pair WCK1 and WCKB1 are provided to one channel has been described in the present example embodiment, the inventive concepts are not limited thereto.

Figure 2:
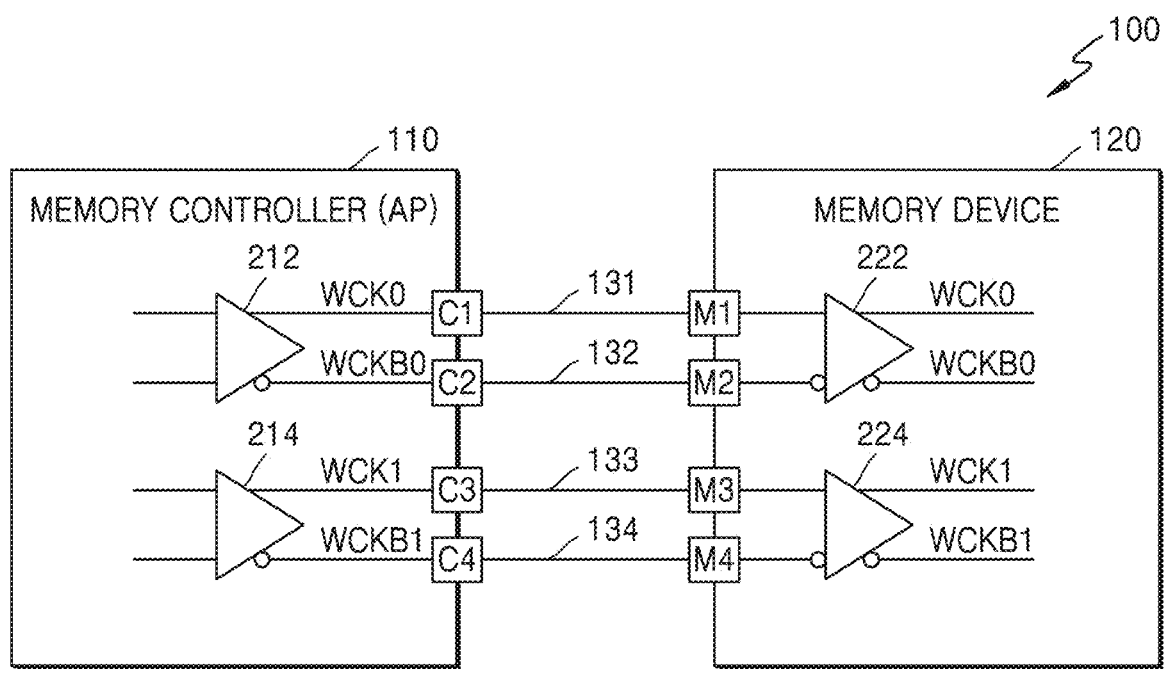
FIG. 2 is a detailed block diagram illustrating a portion of the memory system of FIG. 1.

FIG. 2 is a detailed block diagram illustrating a portion of the memory system 100 of FIG. 1.

Referring to FIG. 2 in connection with FIG. 1, the memory controller 110 may include a first transmitter 212 and a second transmitter 214. The first transmitter 212 may output the first data clock signal pair WCK0 and WCKB0 generated by the data clock generator 111 to the first and second ports C1 and C2 of the memory controller 110. The second transmitter 214 may output the second data clock signal pair WCK1 and WCKB1 generated by the data clock generator 111 to the third and fourth ports C3 and C4 of the memory controller 110.

The first to fourth signal lines 131 to 134 are routed between the first to fourth ports C1 to C4 of the memory controller 110 and the first to fourth ports M1 to M4 of the memory device 120. The first data clock signal pair WCK0 and WCKB0 output to the first and second ports C1 and C2 of the memory controller 110 may be input to the first and second ports M1 and M2 of the memory device 120 via the first and second signal lines 131 and 132. The second data clock signal pair WCK1 and WCKB1 output to the third and fourth ports C3 and C4 of the memory controller 110 may be input to the third and fourth ports M3 and M4 of the memory device 120 via the third and fourth signal lines 133 and 134.

The memory device 120 may include a first receiver 222 for receiving the first data clock signal pair WCK0 and WCKB0 and a second receiver 224 for receiving a second data clock signal pair WCK1 and WCKB1. The first receiver 222 may receive the first data clock signal pair WCK0 and WCKB0 input to the first and second ports M1 and M2 of the memory device 120, and the second receiver 224 may receive the second data clock signal pair WCK1 and WCKB1 input to the third and fourth ports M3 and M4 of the memory device 120.

The memory device 120 may receive the first data group DQ[0:7], which is synchronized with the first data clock signal pair WCK0 and WCKB0 input to the first and second ports M1 and M2 of the memory device 120, from the memory controller 110 via the first data bus 135. The memory device 120 may receive the second data group DQ[8:15], which is synchronized with the second data clock signal pair WCK1 and WCKB1 input to the third and fourth ports M3 and M4 of the memory device 120, from the memory controller 110 via the second data bus 136.

In the memory device 120, the first data group DQ[0:7] may be stored in memory cells of the memory cell array 121 at the operating speed of the first data clock signal pair WCK0 and WCKB0, and the second data group DQ[8:15] may be stored in memory cells of the memory cell array 121 at the operating speed of the second data clock signal pair WCK1 and WCKB1. In the case where the first data group DQ[0:7] and the second data group DQ[8:15] are included in one channel, the operating speed of the first data clock signal pair WCK0 and WCKB0 may be the same as or substantially similar to the operating speed of the second data clock signal pair WCK1 and WCKB1. As an example, both the first data clock signal pair WCK0 and WCKB0 and the second data clock signal pair WCK1 and WCKB1 may have a clock frequency of 1.6 GHz, 3.2 GHz, or 6.4 GHz.

When the clock frequencies of the first data clock signal pair WCK0 and WCKB0 and the second data clock signal pair WCK1 and WCKB1 increase, current consumption due to clocking may increase in the first and second transmitters 212 and 214 that transmit the first data clock signal pair WCK0 and WCKB0 and the second data clock signal pair WCK1 and WCKB1, respectively. Further, current consumption due to clocking may increase in the first and second receivers 222 and 224 that receive the first data clock signal pair WCK0 and WCKB0 and the second data clock signal pair WCK1 and WCKB1, respectively. The current consumption may increase power consumed in the memory controller 110 and the memory device 120, and thus may increase power consumption of the memory system 100.

In the memory device 120, if the memory device 120 receives, for clock sharing, one of the first data clock signal pair WCK0 and WCKB0 and the second data clock signal pair WCK1 and WCKB1 to perform a write operation for the first data group DQ[0:7] and the second data group DQ[8:15], any one of the first and second transmitters 212 and 214 of the memory controller 110 may not need to be clocked. As an example, when the second transmitter 214 is not clocked, the non-clocking operation of the second transmitter 214 may reduce the current consumption of the memory controller 110, thereby reducing the power consumption of the memory system 100. As another example, when the first transmitter 212 is not clocked, the non-clocking operation of the first transmitter 212 may reduce the current consumption of the memory controller 110, thereby reducing the power consumption of the memory system 100. Furthermore, when the first data clock signal pair WCK0 and WCKB1 is received, for clock sharing, by the memory device 120, a signal wiring space of a semiconductor package to be allocated to the non-clocked second data clock signal pair WCK1 and WCKB1 may be used for signal wirings of the first data group DQ[0:7] and the second data group DQ[8:15], and thus, a space between data signal wirings may be widened. Accordingly, the signal integrity of the first data group DQ[0:7] and the second data group DQ[8:15] may be improved.

Figure 3:
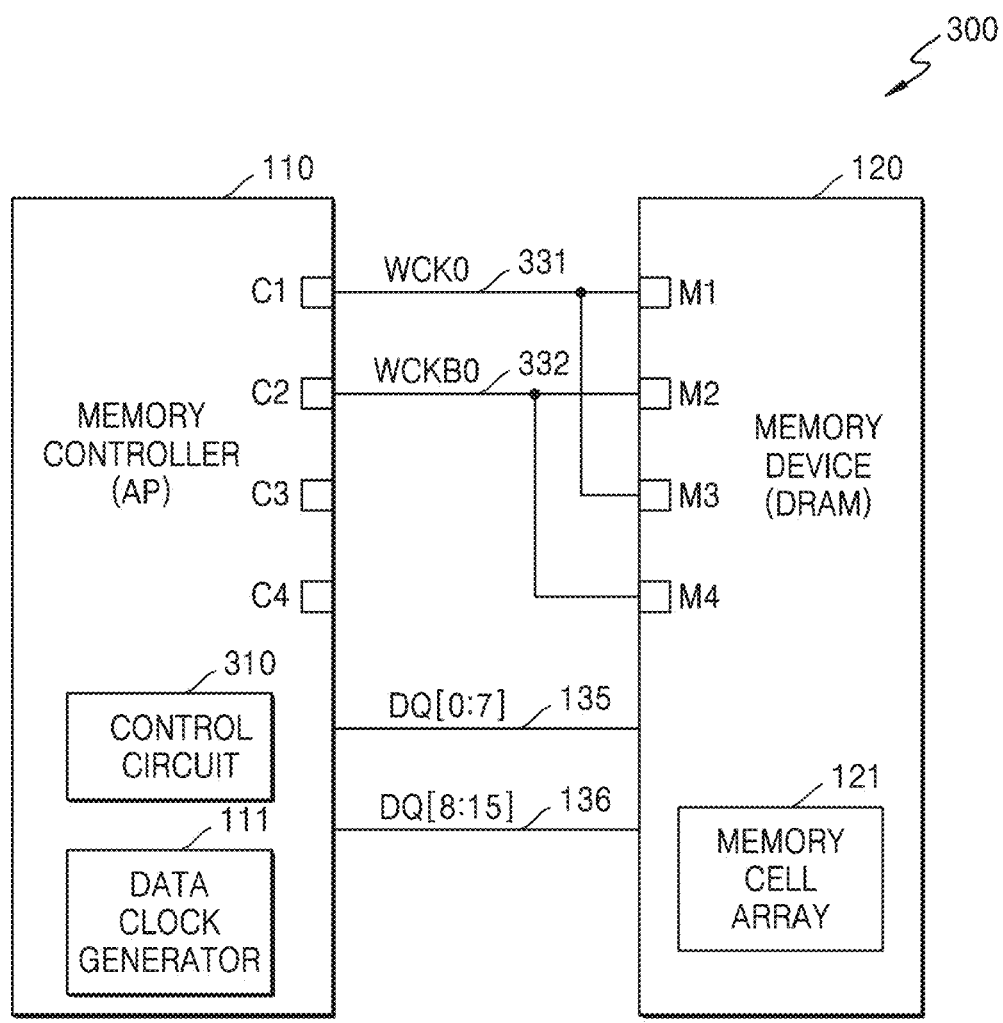
FIG. 3 is a block diagram of a memory system according to an example embodiment of the inventive concepts.

FIG. 3 is a block diagram of a memory system 300 according to an example embodiment of the inventive concepts. The memory system 300 of FIG. 3 is different from the memory system 100 of FIG. 1 in that the routing of first and second signal lines 331 and 332 connected between first to fourth ports C1 to C4 of a memory controller 110 and first to fourth ports M1 to M4 of a memory device 120 is different from that in the memory system 100, and a control circuit 310 is added to the memory controller 110, and the remaining parts of the memory system 300 are the same as or substantially similar to those of the memory system 100. Hereinafter, the difference from FIG. 1 will be mainly described.

Referring to FIG. 3, the memory controller 110 may transmit first data clock signal pair WCK0 and WCKB0 to the first and second signal lines 331 and 332 through the first and second ports C1 and C2, respectively. The memory device 120 may receive the first data clock signal pair WCK0 and WCKB0, transmitted via the first and second signal lines 331 and 332, through the first to fourth ports M1 to M4.

In the memory controller 110, a data clock generator 111 may generate the first data clock signal pair WCK0 and WCKB0 and a second data clock signal pair WCK1 and WCKB1 to control data input and output operations. The first data clock signal pair WCK0 and WCKB0 generated by the data clock generator 111 is output to the first and second signal lines 331 and 332 through the first and second ports C1 and C2, but the second data clock signal pair WCK1 and WCKB1 is not output to the third and fourth ports C3 and C4. The memory controller 110 may control the second data clock signal pair WCK1 and WCKB1 not to be output to the third and fourth ports C3 and C4 of the memory controller 110 by using the control circuit 310.

The memory device 120 may receive a first data group DQ[0:7], which is synchronized with the first data clock signal pair WCK0 and WCKB0 input to the first and second ports M1 and M2 of the memory device 120, from the memory controller 110 via a first data bus 135. The memory device 120 may receive a second data group DQ[8:15], which is synchronized with the first data clock signal pair WCK0 and WCKB0 input to the third and fourth ports M3 and M4 of the memory device 120, from the memory controller 110 via a second data bus 136.

Figure 4:
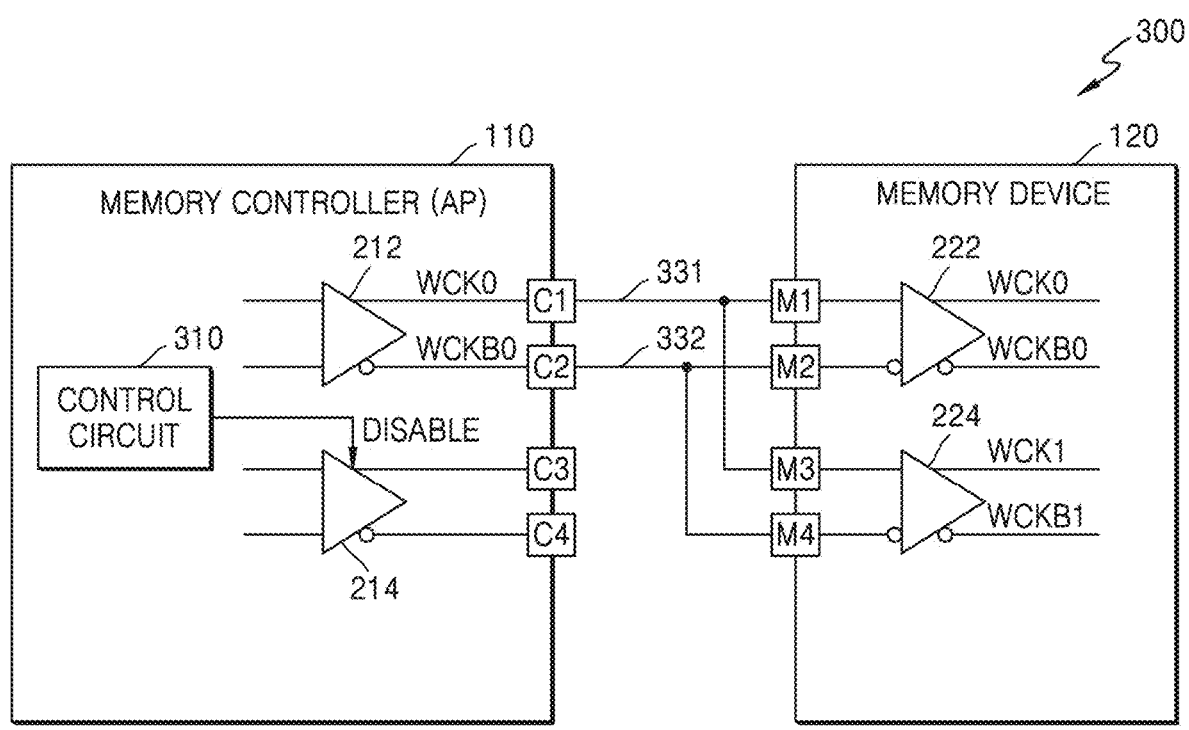
FIG. 4 is a detailed block diagram illustrating a portion of the memory system of FIG. 3.

FIG. 4 is a detailed block diagram illustrating a portion of the memory system 300 of FIG. 3.

Referring to FIG. 4 in connection with FIG. 3, the memory controller 110 may include a first transmitter 212 and a second transmitter 214. The first transmitter 212 may output the first data clock signal pair WCK0 and WCKB0 generated by the data clock generator 111 to the first and second ports C1 and C2 of the memory controller 110. The second transmitter 214 may be disabled in response to a control signal DISABLE provided from the control circuit 310. Accordingly, the second data clock signal pair WCK1 and WCKB1 generated by the data clock generator 111 is not output to the third and fourth ports C3 and C4 of the memory controller 110.

The first and second signal lines 331 and 332 are routed between the first and second ports C1 and C2 of the memory controller 110 and the first to fourth ports M1 to M4 of the memory device 120. The first data clock signal pair WCK0 and WCKB0 output to the first and second ports C1 and C2 of the memory controller 110 may be input to the first and second ports M1 and M2 and the third and fourth ports M3 and M4 of the memory device 120 through the first and second signal lines 331 and 332.

The memory device 120 may include a first receiver 222 and a second receiver 224. The first receiver 222 may receive the first data clock signal pair WCK0 and WCKB0 input to the first and second ports M1 and M2 of the memory device 120, and the second receiver 224 may receive the first data clock signal pair WCK0 and WCKB0 input to the third and fourth ports M3 and M4 of the memory device 120. The first receiver 222 may provide the received first data clock signal pair WCK0 and WCKB0 to the inside of the memory device 120 as a first data clock signal pair WCK0 and WCKB0 correlated with the first data group DQ [0:7]. The second receiver 224 may provide the received first data clock signal pair WCK0 and WCKB0 to the inside of the memory device 120 as a second data clock signal pair WCK1 and WCKB1 correlated with the second data group DQ [8:15].

The memory device 120 may receive the first data group DQ[0:7], which is synchronized with the first data clock signal pair WCK0 and WCKB0 input to the first and second ports M1 and M2 of the memory device 120, from the memory controller 110 via the first data bus 135. The memory device 120 may receive the second data group DQ[8:15], which is synchronized with the first data clock signal pair WCK0 and WCKB0 input to the third and fourth ports M3 and M4 of the memory device 120, from the memory controller 110 via the second data bus 136. The first data group DQ[0:7] received by the memory device 120 may be stored in memory cells of the memory cell array 121 at the operating speed of the first data clock signal pair WCK0 and WCKB0, and the second data group DQ[8:15] may be stored in memory cells of the memory cell array 121 at the operating speed of the second data clock signal pair WCK1 and WCKB1.

In the memory device 120, the first data group DQ[0:7] may be received depending on the first data clock signal pair WCK0 and WCKB0, and then be stored in memory cells of the memory cell array 121 depending on the first data clock signal pair WCK0 and WCKB0. The second data group DQ[8:15] may be received depending on the first data clock signal pair WCK0 and WCKB0, and then be stored in memory cells of the memory cell array 121 depending on the second data clock signal pair WCK1 and WCKB1.

As the operating frequency of the memory device 120 increases, a timing margin between data and a data strobe signal becomes tight. Further, a length from the first and second ports C1 and C2 of the memory controller 110 to the first and second ports M1 and M2 of the memory device 120 is not equal to a length from the first and second ports C1 and C2 of the memory controller 110 to the third and fourth ports M3 and M4 of the memory device 120 and the input capacitances of the first and second ports M1 and M2 are different from the input capacitances of the third and fourth ports M3 and M4, and thus, when the first data clock signal pair WCK0 and WCKB0 is transferred through the first and second signal lines 331 and 332, a skew may occur. Accordingly, the first data clock signal pair WCK0 and WCKB0 output from the first receiver 222 connected to the first and second ports M1 and M2 of the memory device 120 and the second data clock signal pair WCK1 and WCKB1 output from the second receiver 224 connected to the third and fourth ports M3 and M4 of the memory device 120 may have a skew. This skew may cause a malfunction due to lack of a timing margin in a write operation for the first data group DQ[0:7] or the second data group DQ[8:15].

The memory 110 may control the transmission of the first data group DQ[0:7] and/or the second data group DQ[8:15] so that the first data group DQ[0:7] transmitted to the first data bus 135 and the second data group DQ[8:15] transmitted to the second data bus 136 are synchronized with the first data clock signal pair WCK0 and WCKB0, in consideration of the skew caused by the first and second signal lines 331 and 332 through which the first data clock signal pair WCK0 and WCKB0 is transmitted.

As an example, the memory controller 110 may selectively delay the transmission time point of the first data group DQ[0:7] and/or the transmission time point of the second data group DQ[8:15] by using the control circuit 310. When it is determined that a timing margin in a write operation for the first data group DQ[0:7] and the second data group DQ[8:15] is sufficient even though a skew is caused by the first and second signal lines 331 and 332, through which the first data clock signal pair WCK0 and WCKB0 is transmitted, the control circuit 310 of the memory controller 110 may control the transmission time point of the first data group DQ[0:7] to be the same as that of the second data group DQ[8:15].

Figure 5A:
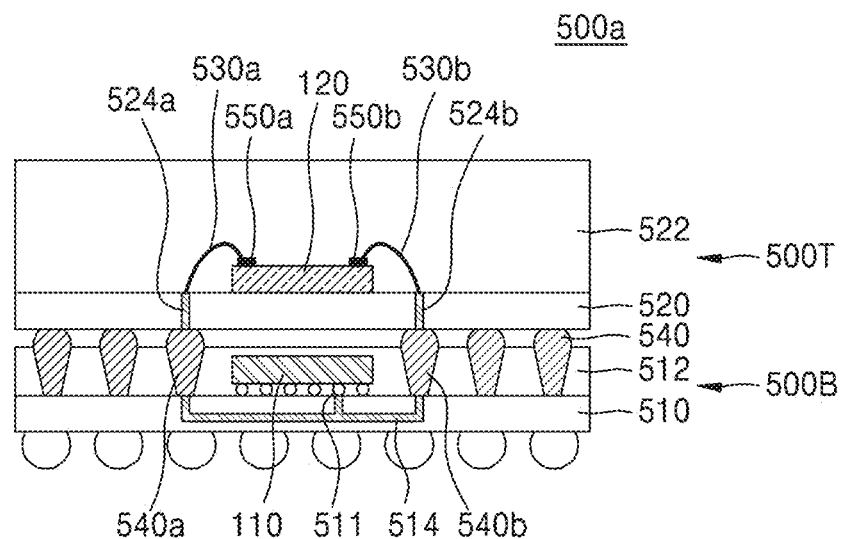
FIGS. 5A and 5B are cross-sectional views of package-on-package (PoP) semiconductor packages including a memory system according to an example embodiment of the inventive concepts.
Figure 5B:
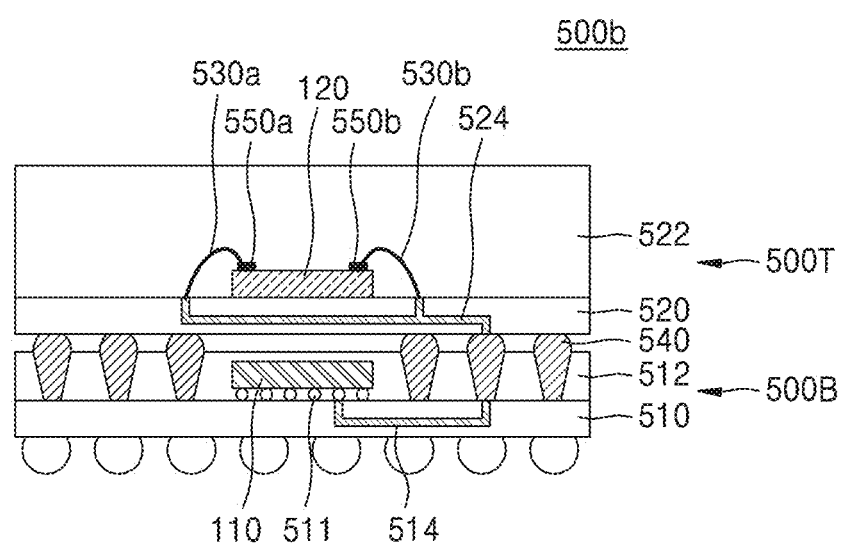

FIGS. 5A and 5B are cross-sectional views of package-on-package (PoP) semiconductor packages 500a and 500b including a memory system according to an example embodiment of the inventive concepts. The PoP semiconductor packages 500a and 500b of FIGS. 5A and 5B may include the memory system 300 of FIG. 3.

Referring to FIG. 5A, the PoP semiconductor package 500a may include a lower package 500B and an upper package 500T. The lower package 500B may include a memory controller 110 mounted on a lower package substrate 510. The memory controller 110 may be mounted on the lower package substrate 510 by a conductive bump 511. A lead-free tin-based solder ball may be used as the conductive bump 511. The memory controller 110 may be encapsulated by an encapsulation material 512. The encapsulation material 512 may be, for example, an epoxy molding compound (EMC).

A plurality of vertical interconnections 540 may be arranged around the memory controller 110. The plurality of vertical interconnections 540 may extend through the encapsulation material 512. The plurality of vertical interconnections 540 may refer to conductors capable of electrically connecting the lower package 500B to the upper package 500T, which are vertically stacked. In some example embodiments, the plurality of vertical interconnections 540 may be solder bumps or conductive plugs.

The upper package 500T may include a memory device 120 mounted on an upper package substrate 520. The memory device 120 may be electrically connected to the upper package substrate 520 by bonding wires 530a and 530b. The memory device 120 may be encapsulated by an encapsulation material 522. The encapsulation material 522 may be, for example, an epoxy molding compound.

As described above with reference to FIG. 3, the first data clock signal pair WCK0 and WCKB0 output to the first and second ports C1 and C2 of the memory controller 110 may be input to the first and second ports M1 and M2 and the third and fourth ports M3 and M4 of the memory device 120 through the first and second signal lines 331 and 332. A first data clock signal WCK0 and a first complementary data clock signal WCKB0, which constitute the first data clock signal pair WCK0 and WCKB0, are differential signals having complementary phases. In the present example embodiment, only the first signal line 331 through which the first data clock signal WCK0 is transmitted will be described for convenience of description. The description of the first signal line 331 through which the first data clock signal WCK0 is transmitted may be equally applied to the second signal line 332 through which the first complementary data clock signal WCKB0 is transmitted.

The memory controller 110 of the lower package 500B may output the first data clock signal WCK0 through the conductive bump 511. The conductive bump 511 may correspond to the first port C1 of the memory controller 110 in FIG. 3. The conductive bump 511 may be electrically connected to first and second vertical interconnections 540a and 540b through a first wiring line 514 formed in the lower package substrate 510. The first and second vertical interconnections 540a and 540b may be electrically connected to first and second bonding wires 530a and 530b, respectively, through second wiring lines 524a and 524b formed in the upper package substrate 520. The second wiring lines 524a and 524b may be formed in the upper package substrate 520 and/or on the surface of the upper package substrate 520. The first and second bonding wires 530a and 530b may be electrically connected to first and second pads 550a and 550b of the memory device 120. The first pad 550a of the memory device 120 may correspond to the first port M1 in FIG. 3, and the second pad 550b of the memory device 120 may correspond to the third port M3 in FIG. 3.

In connection with FIG. 3, in the PoP semiconductor package 500a, the first data clock signal WCK0 output from the first port C1 of the memory controller 110 may be branched at the first wiring line 514 formed in the lower package substrate 510. The first data clock signal WCK0 branched at the first wiring line 514 may be provided to the first port M1 of the memory device 120 through the first signal line 331 that includes the first vertical interconnection 540a, the second wiring line 524a, and the first bonding wire 530a and be provided to the third port M3 of the memory device 120 through the first signal line 331 that includes the second vertical interconnection 540b, the second wiring line 524b, and the second bonding wire 530b.

Referring to FIG. 5B, the PoP semiconductor package 500b is different from the PoP semiconductor package 500a of FIG. 5A in that the first data clock signal WCK0 output from the memory controller 110 is branched at a second wiring line 524 formed in the upper package substrate 520 and provided to the memory device 120, and the remaining portions of the PoP semiconductor package 500b are the same as or substantially similar to those of the PoP semiconductor package 500a. Hereinafter, the difference from FIG. 5A will be mainly described.

The memory controller 110 of the lower package 500B may output the first data clock signal WCK0 through a conductive bump 511. The conductive bump 511 may be electrically connected to a vertical interconnection 540 through a first wiring line 514 formed in the lower package substrate 510. The vertical interconnection 540 may be electrically connected to the first and second bonding wires 530a and 530b through the second wiring line 524 formed in the upper package substrate 520. The first and second bonding wires 530a and 530b may be electrically connected to the first and second pads 550a and 550b of the memory device 120.

In connection with FIG. 3, in the PoP semiconductor package 500b, the first data clock signal WCK0 output from the first port C1 of the memory controller 110 may be transferred to the second wiring line 524, which is formed in the upper package substrate 520, via the first wiring line 514, which is formed in the lower package substrate 510, and the vertical interconnection 540, may be branched at the second wiring line 524, and may be provided to the memory device 120. The first data clock signal WCK0 branched at the second wiring line 524 may be provided to the first port M1 of the memory device 120 through the first bonding wire 530a and be provided to the third port M3 of the memory device 120 through the second bonding wire 530b.

Figure 6A:
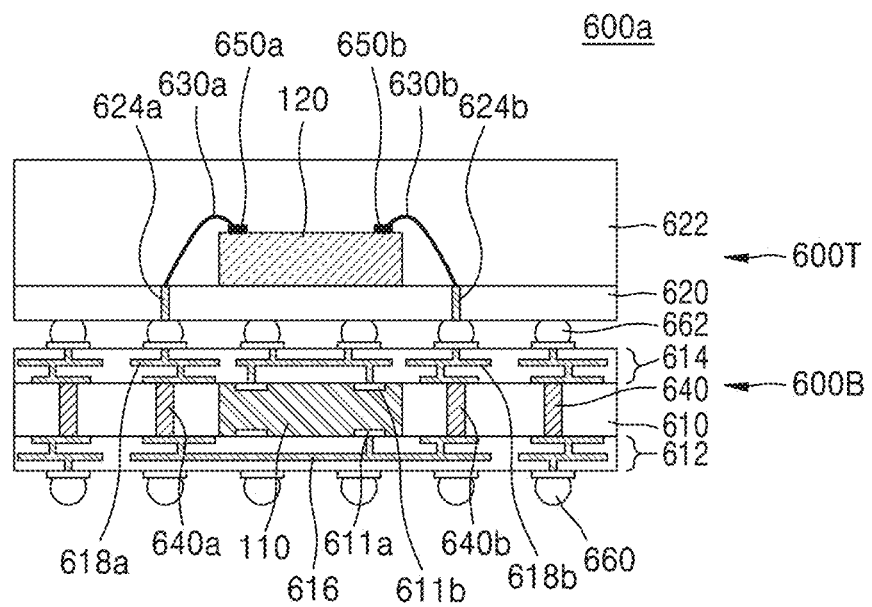
FIGS. 6A, 6B, and 6C are cross-sectional views of PoP semiconductor packages including a memory system according to an example embodiment of the inventive concepts.
Figure 6B:
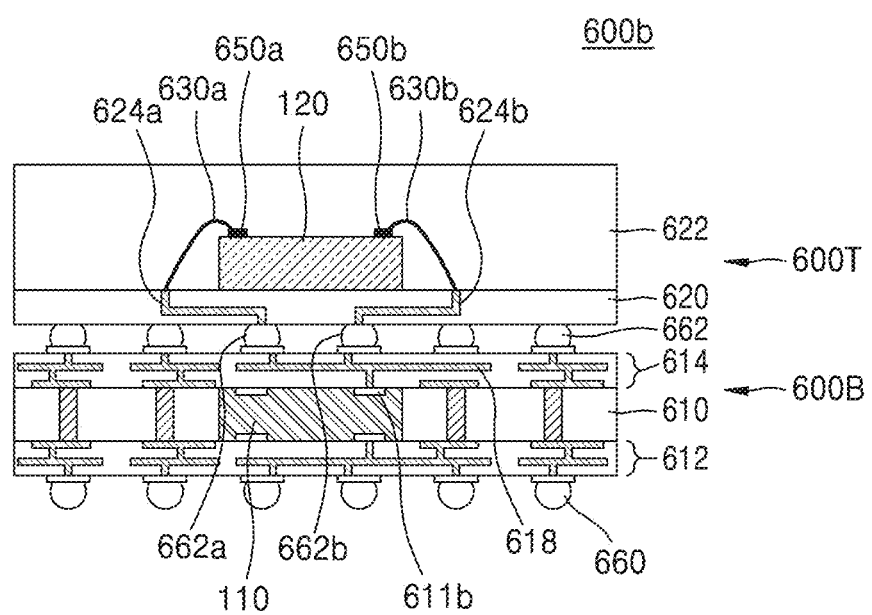
Figure 6C:
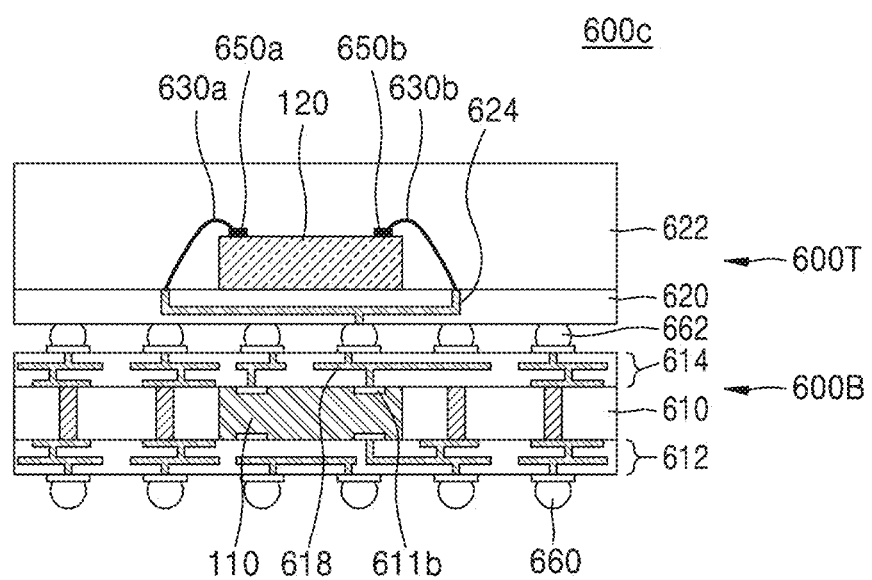

FIGS. 6A, 6B, and 6C are cross-sectional views of PoP semiconductor packages 600a, 600b, and 600c including a memory system according to an example embodiment of the inventive concepts. The PoP semiconductor packages 600a, 600b, and 600c of FIGS. 6A, 6B, and 6C may include the memory system 300 of FIG. 3.

Referring to FIG. 6A, the PoP semiconductor package 600a may include an upper package 600T and a lower package 600B.

The upper package 600T may include a memory device 120 mounted on an upper package substrate 620. The memory device 120 may be electrically connected to the upper package substrate 620 by first and second bonding wires 630a and 630b. The memory device 120 may be encapsulated by an encapsulation material 622.

The lower package 600B may include a memory controller 110 embedded in a lower package substrate 610. The lower package 600B may have an upper redistribution interposer 614, which is adjacent to an upper surface of the lower package 600B, and a lower redistribution interposer 612, which is adjacent to a lower surface of the lower package 600B. The upper redistribution interposer 614 and the lower redistribution interposer 612 may be configured to electrically connect connection terminals 611a and 611b of the memory controller 110 to the upper package 600T and/or an external device.

In FIG. 6A, each of the upper redistribution interposer 614 and the lower redistribution interposer 612 includes one layer. However, each of the upper redistribution interposer 614 and the lower redistribution interposer 612 may include a plurality of layers. The upper redistribution interposer 614 may be referred to as an upper redistribution layer, and the lower redistribution interposer 612 may be referred to as a lower redistribution layer. As a semiconductor chip becomes highly integrated, a printed circuit board frequently fails to accommodate the high integration density of the semiconductor chip. To solve this problem, a package structure in which an interposer is between a semiconductor chip and a package substrate may be used. Interposers using silicon substrates are advantageous for micromachining but are difficult to manufacture and expensive. Thus, relatively inexpensive redistribution interposers may be used. The upper redistribution interposer 614 and the lower redistribution interposer 612 may be obtained by forming a passivation layer, which is an insulator, by using deposition and forming a conductor wiring line through patterning or plating.

In the lower package substrate 610, via structures for connecting terminals of the upper redistribution interposer 614 to terminals of the lower redistribution interposer 612 may be provided as vertical interconnections 640. Although the vertical interconnections 640 (e.g., the via structures) are shown as having a pillar shape in FIG. 6A, the vertical interconnections 640 may have a tapered shape, or may have a combination of two or more tiers. The terminals of the upper redistribution interposer 614 may be connected to connection terminals 662 for connecting with the upper package 600T, and the terminals of the lower redistribution interposer 612 may be connected to connection terminals 660 for connecting with an external device.

The memory controller 110 of the lower package 600B may output the first data clock signal WCK0 through the connection terminal 611a. The connection terminal 611a may correspond to the first port C1 (see FIG. 3) of the memory controller 110. The connection terminal 611a may be electrically connected to first and second vertical interconnections 640a and 640b through a first wiring line 616 formed in the lower redistribution interposer 612. The first and second vertical interconnections 640a and 640b may be respectively and electrically connected to third wiring lines 624a and 624b, which are formed in the upper package substrate 620, through second wiring lines 618a and 618b, which are formed in the upper redistribution interposer 614, and the connection terminals 662 for connecting with the upper package 200T. The third wiring lines 624a and 624b formed in the upper package substrate 620 may be electrically connected to first and second pads 650a and 650b of the memory device 120 through the first and second bonding wires 630a and 630b, respectively. The first pad 650a of the memory device 120 may correspond to the first port M1 shown in FIG. 3 and the second pad 650b of the memory device 120 may correspond to the third port M3 shown in FIG. 3.

In connection with FIG. 3, in the PoP semiconductor package 600a, the first data clock signal WCK0 output from the first port C1 of the memory controller 110 may be branched at the first wiring line 616 formed in the lower redistribution interposer 612 and provided to the first port M1 and the third port M3 of the memory device 120.

Referring to FIG. 6B, the PoP semiconductor package 600b is different from the PoP semiconductor package 600a of FIG. 6A in that the first data clock signal WCK0 output from the memory controller 110 is branched at a second wiring line 618 formed in the upper redistribution interposer 614 and provided to the memory device 120, and the remaining portions of the PoP semiconductor package 600b are the same as or substantially similar to those of the PoP semiconductor package 600a. Hereinafter, the difference from FIG. 6A will be mainly described.

The memory controller 110 of the lower package 600B may output the first data clock signal WCK0 through a connection terminal 611b. The connection terminal 611b may correspond to the first port C1 (see FIG. 3) of the memory controller 110. The connection terminal 611b may be electrically connected to connection terminals 662a and 662b for connecting with the upper package 600T, through the second wiring line 618 formed in the upper redistribution interposer 614, and the connection terminals 662a and 662b for connecting with the upper package 600T may be electrically connected to third wiring lines 624a and 624b formed in the upper package substrate 620. The third wiring lines 624a and 624b formed in the upper package substrate 620 may be electrically connected to the first and second pads 650a and 650b of the memory device 120 through first and second bonding wires 630a and 630b.

In connection with FIG. 3, in the PoP semiconductor package 600b, the first data clock signal WCK0 output from the first port C1 of the memory controller 110 may be branched at the second wiring line 618 formed in the upper redistribution interposer 614 and provided to the first port M1 and the third port M3 of the memory device 120.

Referring to FIG. 6C, the PoP semiconductor package 600c is different from the PoP semiconductor package 600a of FIG. 6A in that the first data clock signal WCK0 output from the memory controller 110 is branched at a third wiring line 624 formed in the upper package substrate 620 and provided to the memory device 120, and the remaining portions of the PoP semiconductor package 600c are the same as or substantially similar to those of the PoP semiconductor package 600a. Hereinafter, the difference from FIG. 6A will be mainly described.

The memory controller 110 of the lower package 600B may output the first data clock signal WCK0 through a connection terminal 611b. The connection terminal 611b may correspond to the first port C1 (see FIG. 3) of the memory controller 110. The connection terminal 611b may be electrically connected to a connection terminal 662 for connecting with the upper package 600T, through a second wiring line 618 formed in the upper redistribution interposer 614, and the connection terminal 662 for connecting with the upper package 600T may be electrically connected to the third wiring line 624 formed in the upper package substrate 620. The third wiring line 624 formed in the upper package substrate 620 may be electrically connected to the first and second pads 650a and 650b of the memory device 120 through first and second bonding wires 630a and 630b.

In connection with FIG. 3, in the PoP semiconductor package 600c, the first data clock signal WCK0 output from the first port C1 of the memory controller 110 may be branched at the third wiring line 624 formed in the upper package substrate 620 and provided to the first port M1 and the third port M3 of the memory device 120.

Figure 7A:
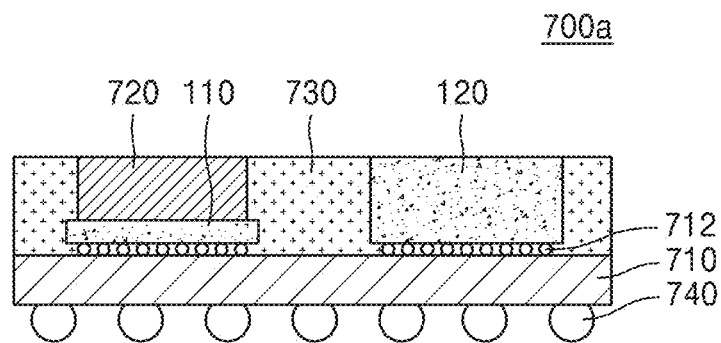
FIGS. 7A and 7B are conceptual diagrams illustrating semiconductor packages including a memory system according to an example embodiment of the inventive concepts.
Figure 7B:
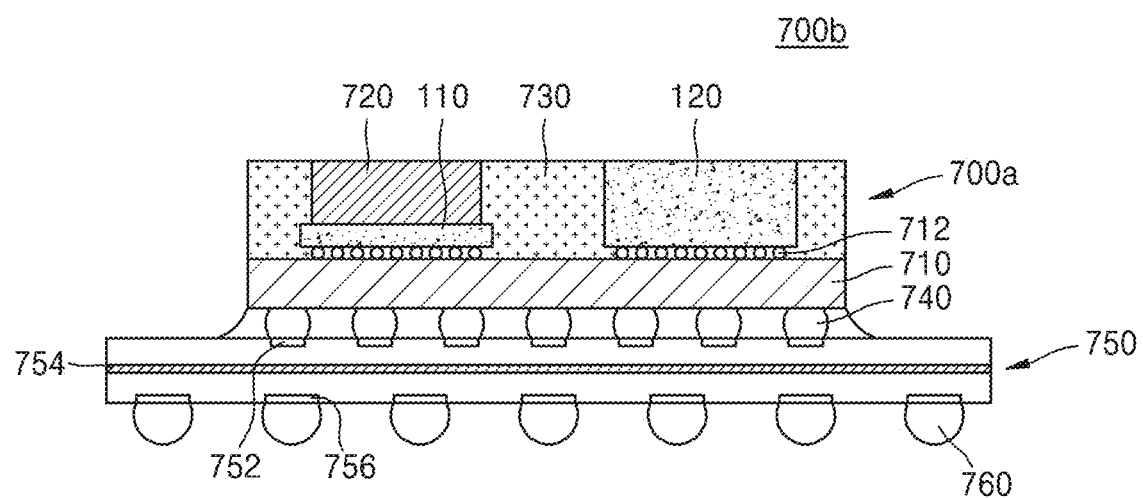

FIGS. 7A and 7B are conceptual diagrams illustrating semiconductor packages 700a and 700b including a memory system according to an example embodiment of the inventive concepts. The semiconductor packages 700a and 700b of FIGS. 7A and 7B may include the memory system 300 of FIG. 3.

Referring to FIG. 7A, the memory controller 110 and the memory device 120 may be horizontally mounted on an interposer 710. The memory controller 110 and/or the memory device 120 may be directly mounted on the interposer 710 by micro-bumps 712.

The memory device 120 may include a plurality of semiconductor chips sequentially stacked on a sub-package substrate. The plurality of semiconductor chips may be stacked in the vertical direction. The plurality of semiconductor chips may include 2 to 16 semiconductor chips. The plurality of semiconductor chips may include a through silicon via (TSV) structure and may be electrically connected to each other through the TSV structure. Furthermore, the plurality of semiconductor chips may be electrically connected to the sub-package substrate through the TSV structure. The sub-package substrate may be, for example, a printed circuit board, a ceramic substrate, or an interposer. For example, the memory device 120 may include a high bandwidth memory (HBM).

In the memory controller 110, considerable heat may be generated during operations. In order to remove or mitigate heat generated in the memory controller 110, a heat dissipating member 720 may be provided on the memory controller 110. The heat dissipating member 720 may be, for example, a heat sink, a heat spreader, a heat pipe, or a liquid cooled cold plate. The heat dissipating member 720 may be coupled to the memory controller 110 by a heat transfer material layer (not shown). The heat transfer material layer may include an insulating material, or may include a material including an insulating material and capable of maintaining electrical insulation. The heat transfer material layer may include, for example, an epoxy resin. The heat transfer material layer may include, for example, mineral oil, grease, gap filler putty, phase change gel, phase change material pads, or particle-filled epoxy.

The memory controller 110 and the memory device 120 may be sealed by a molding member 730. The molding member 730 may expose top surfaces of the heat dissipating member 720 and the memory device 120.

In the example embodiment shown in FIG. 7A, the interposer 710 itself may be used as a package substrate. When the interposer 710 includes a small number of unit redistribution interposers, the interposer 710 may be flexible and may be applied to various electronic products desired to be flexible. External connection terminals 740 may be attached to the lower surface of the interposer 710.

In connection with FIG. 3, in the semiconductor package 700a, the first data clock signal pair WCK0 and WCKB0 output from the first and second ports C1 and C2 of the memory controller 110 may be branched at first and second signal lines 331 and 332 formed in the interposer 710 and provided to the first and second ports M1 and M2 and the third and fourth ports M3 and M4 of the memory device 120.

Referring to FIG. 7B, the semiconductor package 700b may be obtained by mounting the semiconductor package 700a of FIG. 7A on a package substrate 750. The package substrate 750 may be, for example, a printed circuit board, a ceramic substrate, or an interposer. When the package substrate 750 is a printed circuit board, the package substrate 750 may include a substrate base 754 therein, and an upper surface pad 752 and a lower surface pad 756 may be provided on an upper surface and a lower surface of the substrate base 754, respectively. The upper surface pad 752 and the lower surface pad 756 may be exposed by a solder resist layer that covers the upper and lower surfaces of the substrate base 754. The substrate base 754 may include at least one material selected from phenol resin, epoxy resin, and polyimide.

An external connection terminal 760 may be attached to a lower surface of the package substrate 750. The external connection terminal 760 may be attached, for example, on the lower surface pad 756. The external connection terminal 760 may be, for example, a solder ball or a bump. The external connection terminal 760 may electrically connect the semiconductor package 700b to an external device.

An internal wiring line for electrically connecting the upper surface pad 752 to the lower surface pad 756 may be formed in the substrate base 754. The upper surface pad 752 and the lower surface pad 756 may be a portion, exposed by the solder resist layer, of a circuit wiring layer patterned after coating a copper (Cu) foil on the upper surface and the lower surface of the substrate base 754. An internal wiring line may be formed in the upper surface, lower surface, and/or inside of the substrate base 754. Further, a through-via for electrically connecting the upper surface pad 752 to the lower surface pad 756 may be formed in the substrate base 754.

In connection with FIG. 3, in the semiconductor package 700b, the first data clock signal pair WCK0 and WCKB0 output from the first and second ports C1 and C2 of the memory controller 110 may be branched at first and second signal lines 331 and 332 formed in the substrate base 754, and provided to the first and second ports M1 and M2 and the third and fourth ports M3 and M4 of the memory device 120.

Figure 8:
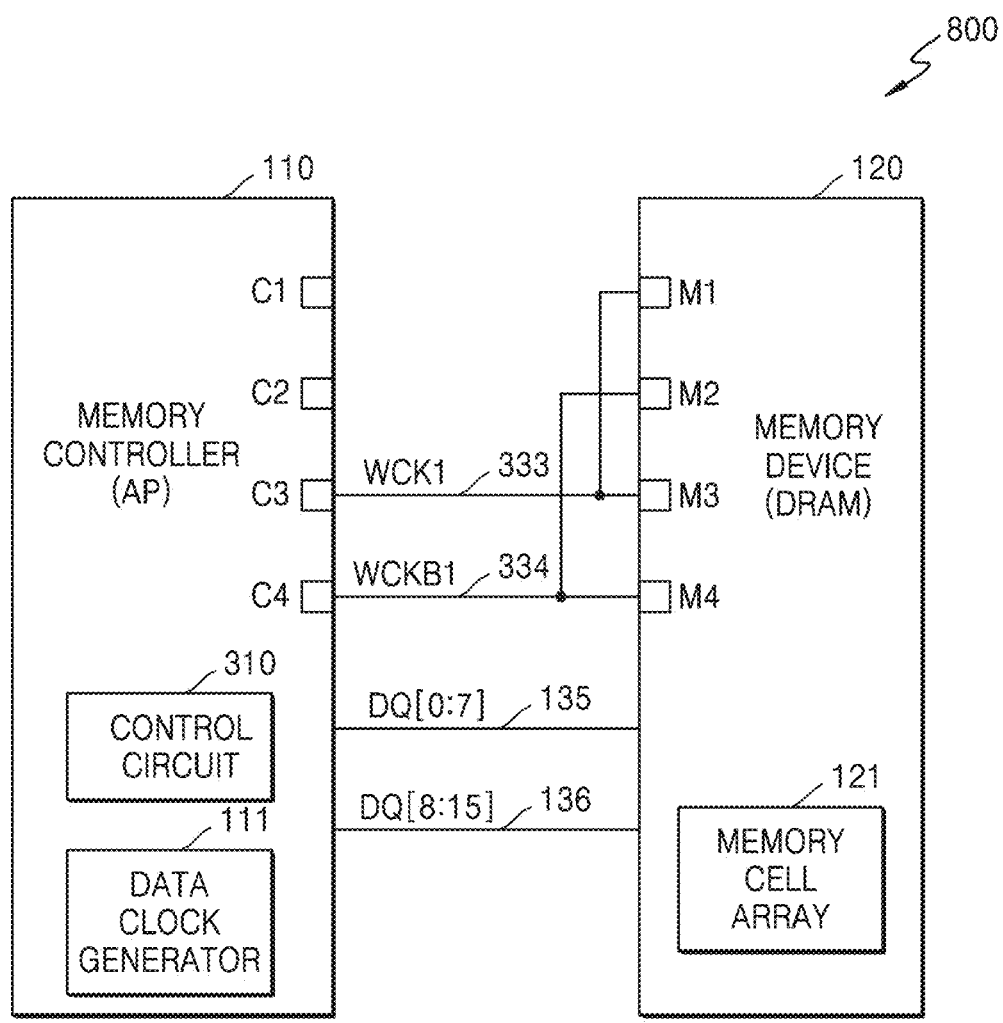
FIG. 8 is a block diagram of a memory system according to an example embodiment of the inventive concepts.

FIG. 8 is a block diagram of a memory system 800 according to an example embodiment of the inventive concepts. The memory system 800 of FIG. 8 is different from the memory system 300 of FIG. 3 in that the routing of third and fourth signal lines 333 and 334 connected between first to fourth ports C1 to C4 of a memory controller 110 and first to fourth ports M1 to M4 of a memory device 120 is different from that in the memory system 300, and the remaining parts of the memory system 800 are the same as or substantially similar to those of the memory system 300. Hereinafter, the difference from FIG. 3 will be mainly described.

Referring to FIG. 8, the memory controller 110 may transmit second data clock signal pair WCK1 and WCKB1 to the third and fourth signal lines 333 and 334 through the third and fourth ports C1 and C2, respectively. The memory device 120 may receive the second data clock signal pair WCK1 and WCKB1, which are transmitted via the third and fourth signal lines 333 and 334, through the first to fourth ports M1 to M4.

In the memory controller 110, a data clock generator 111 may generate a first data clock signal pair WCK0 and WCKB0 and the second data clock signal pair WCK1 and WCKB1 to control data input and output operations. The second data clock signal pair WCK1 and WCKB1 generated by the data clock generator 111 may be output to the third and fourth signal lines 333 and 334 through the third and fourth ports C3 and C4, while not outputting the first data clock signal pair WCK0 and WCKB0 to the first and second ports C1 and C2. The memory controller 110 may control the first data clock signal pair WCK0 and WCKB0 not to be output to the first and second ports C1 and C2 of the memory controller 110 by using a control circuit 310.

The memory device 120 may receive a first data group DQ[0:7], which is synchronized with the second data clock signal pair WCK1 and WCKB1 that is input to the first and second ports M1 and M2 of the memory device 120, from the memory controller 110 via a first data bus 135. The memory device 120 may receive a second data group DQ[8:15], which is synchronized with the second data clock signal pair WCK1 and WCKB1 that is input to the third and fourth ports M3 and M4 of the memory device 120, from the memory controller 110 via a second data bus 136.

Figure 9:
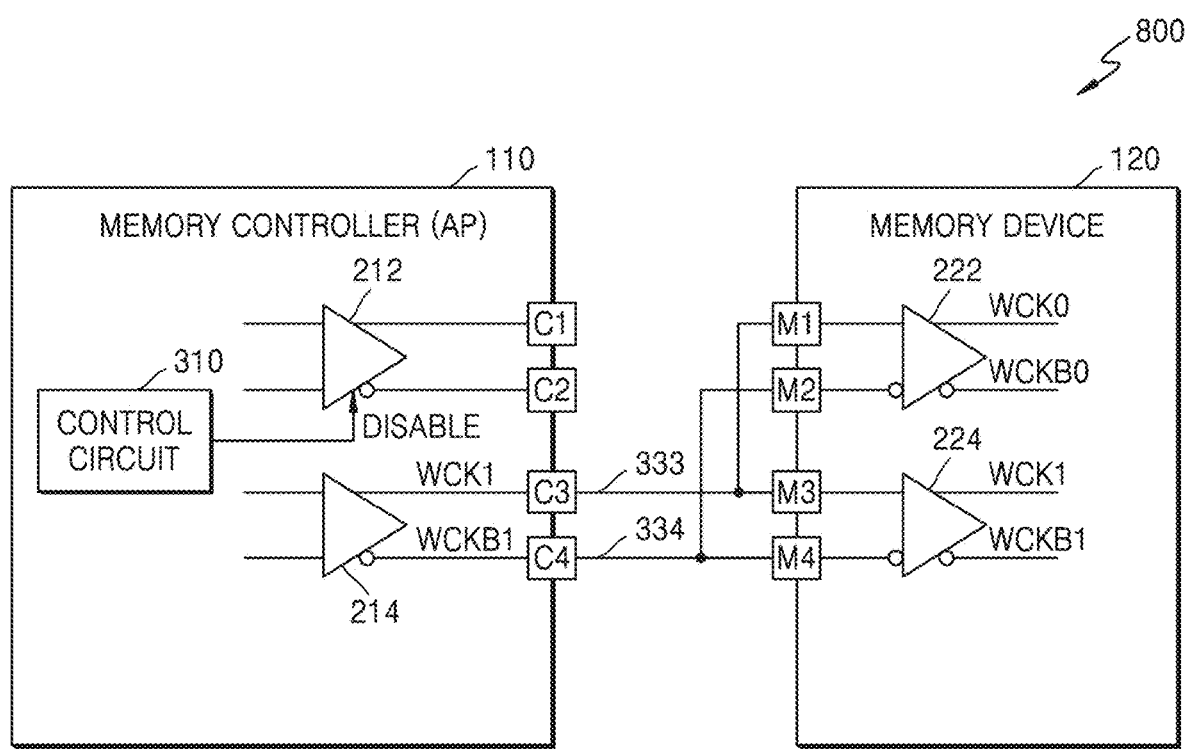
FIG. 9 is a detailed block diagram illustrating a portion of the memory system of FIG. 8.

FIG. 9 is a detailed block diagram illustrating a portion of the memory system 800 of FIG. 8.

Referring to FIG. 9 in connection with FIG. 8, the memory controller 110 may include a first transmitter 212 and a second transmitter 214. The first transmitter 212 may be disabled in response to a control signal DISABLE provided from the control circuit 310. Accordingly, the first data clock signal pair WCK0 and WCKB0 generated by the data clock generator 111 is not output to the first and second ports C1 and C2 of the memory controller 110. The second transmitter 214 may output the second data clock signal pair WCK1 and WCKB1 generated by the data clock generator 111 to the third and fourth ports C3 and C4 of the memory controller 110.

The third and fourth signal lines 333 and 334 are routed between the third and fourth ports C3 and C4 of the memory controller 110 and the first to fourth ports M1 to M4 of the memory device 120. The second data clock signal pair WCK1 and WCKB1 output to the third and fourth ports C3 and C4 of the memory controller 110 may be input to the first and second ports M1 and M2 and the third and fourth ports M3 and M4 of the memory device 120 through the third and fourth signal lines 333 and 334.

The memory device 120 may include a first receiver 222 and a second receiver 224. The first receiver 222 may receive the second data clock signal pair WCK1 and WCKB1 input to the first and second ports M1 and M2 of the memory device 120, and the second receiver 224 may receive the second data clock signal pair WCK1 and WCKB1 input to the third and fourth ports M3 and M4 of the memory device 120. The first receiver 222 may provide the received second data clock signal pair WCK1 and WCKB1 to the inside of the memory device 120 as a first data clock signal pair WCK0 and WCKB0 correlated with the first data group DQ [0:7]. The second receiver 224 may provide the received second data clock signal pair WCK1 and WCKB1 as a second data clock signal pair WCK1 and WCKB1 correlated with the second data group DQ [8:15].

In the memory device 120, the first data group DQ[0:7] may be received depending on the second data clock signal pair WCK1 and WCKB1, and then be stored in memory cells of the memory cell array 121 depending on the first data clock signal pair WCK0 and WCKB0. The second data group DQ[8:15] may be received depending on the second data clock signal pair WCK1 and WCKB1, and then be stored in memory cells of the memory cell array 121 depending on the second data clock signal pair WCK1 and WCKB1.

The memory controller 110 may control the transmission of the first data group DQ[0:7] and/or the second data group DQ[8:15] so that the first data group DQ[0:7] transmitted to the first data bus 135 and the second data group DQ[8:15] transmitted to the second data bus 136 are synchronized with the second data clock signal pair WCK1 and WCKB1, in consideration of a skew caused by the third and fourth signal lines 333 and 334 through which the second data clock signal pair WCK1 and WCKB1 is transmitted.

The memory controller 110 may selectively delay the transmission time point of the first data group DQ[0:7] and/or the transmission time point of the second data group DQ[8:15] by using the control circuit 310. When it is determined that a timing margin in a write operation for the first data group DQ[0:7] and the second data group DQ[8:15] is sufficient even though a skew is caused by the third and fourth signal lines 333 and 334, through which the second data clock signal pair WCK1 and WCKB1 is transmitted, the control circuit 310 of the memory controller 110 may control the transmission time point of the first data group DQ[0:7] to be the same as that of the second data group DQ[8:15].

The memory system 800 of FIGS. 8 and 9 may be included in any one of the semiconductor packages 500a, 500b, 600a, 600b, 600c, 700a, and 700b described with reference to FIGS. 5A to 7B. Accordingly, the second data clock signal pair WCK1 and WCKB1 provided from the memory controller 110 to the memory device 120 may be branched at a signal line formed in the lower package substrate 510 of the PoP semiconductor package 500a of FIG. 5A, branched at a signal line formed in the upper package substrate 520 of the PoP semiconductor package 500b of FIG. 5B, branched at a signal line formed in the lower redistribution interposer 612 of the PoP semiconductor package 600a of FIG. 6A, branched at a signal line formed in the upper redistribution interposer 614 of the PoP semiconductor package 600b of FIG. 6B, branched at a signal line formed in the upper package substrate 620 of the PoP semiconductor package 600c of FIG. 6C, branched at a signal line formed in the interposer 710 of the semiconductor package 700a of FIG. 7A, or branched at a signal line formed in the substrate base 754 of the semiconductor package 700b of FIG. 7B.

Figure 10:
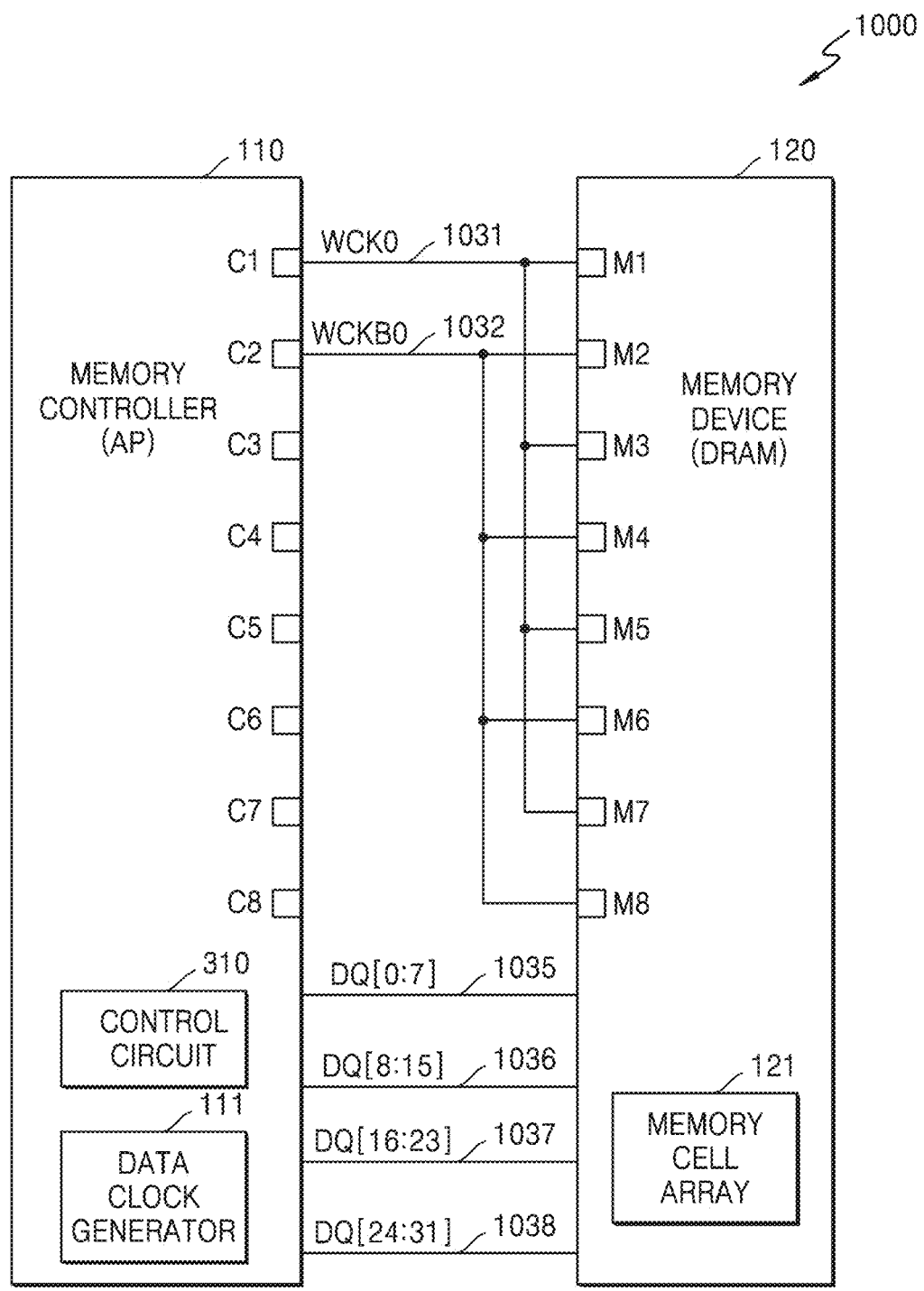
FIGS. 10 and 11 are block diagrams illustrating a memory system according to an example embodiment of the inventive concepts.
Figure 11:
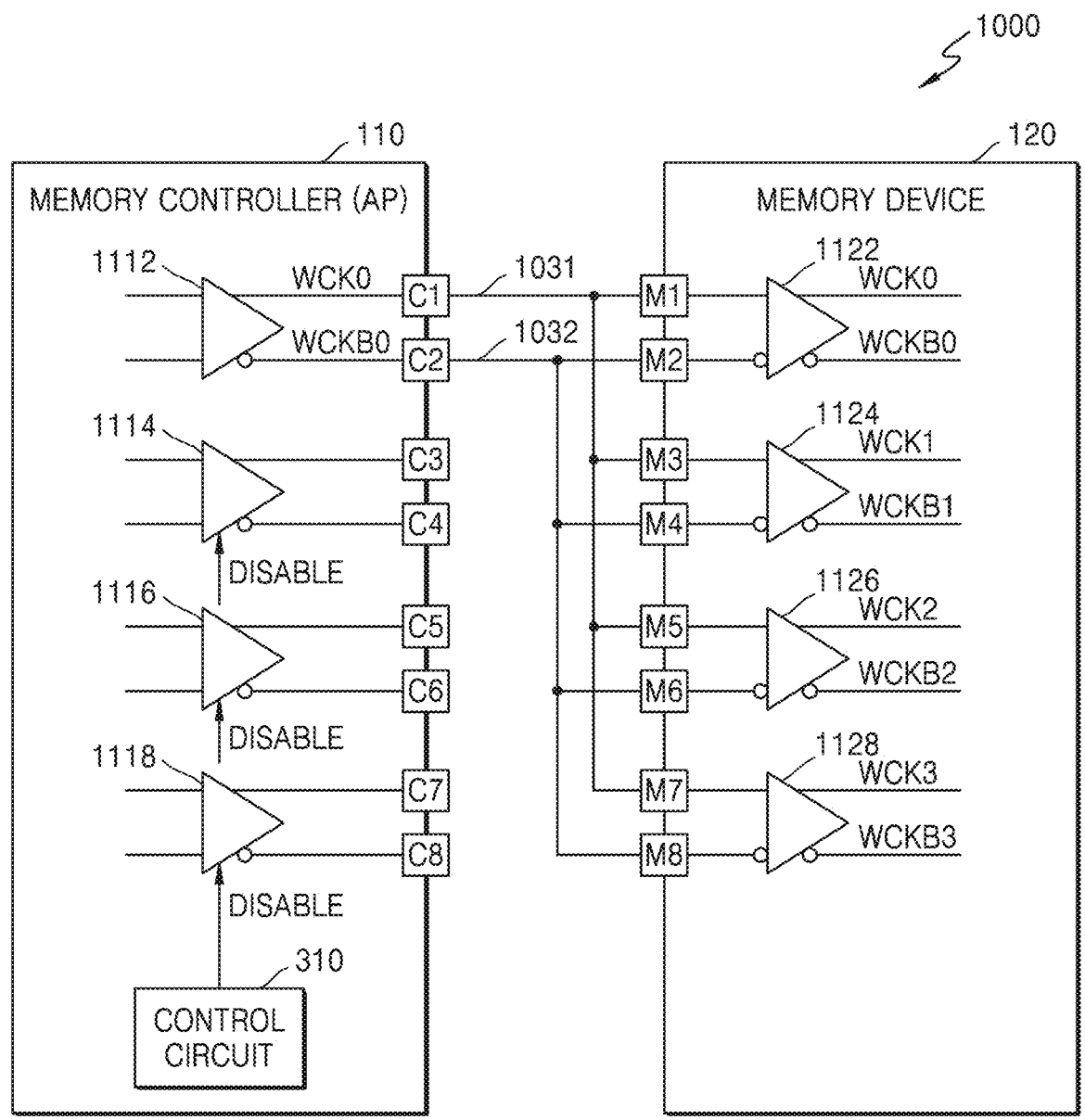

FIGS. 10 and 11 are block diagrams illustrating a memory system 1000 according to an example embodiment of the inventive concepts.

Referring to FIG. 10, the memory system 1000 may provide a first data clock signal pair WCK0 and WCKB0, output from first and second ports C1 and C2 of a memory controller 110, to first to eighth ports M1 to M8 of a memory device 120 through first and second signal lines 1031 and 1032. Between the memory controller 110 and the memory device 120, a first data group DQ[0:7] may be transmitted through a first data bus 1035, a second data group DQ[8:15] may be transmitted through a second data bus 1036, a third data group DQ[16:23] may be transmitted through a third data bus 1037, and a fourth data group DQ[24:31] may be transmitted through a fourth data bus 1038.

In the memory controller 110, a data clock generator 111 may generate first to fourth data clock signal pairs WCK0, WCKB0, WCK1, WCKB1, WCK2, WCKB2, WCK3, and WCKB3 for controlling data input/output. The first data clock signal pair WCK0 and WCKB0 generated by the data clock generator 111 may be output to the first and second signal lines 1031 and 1032 through the first and second ports C1 and C2, while not outputting the second to fourth data clock signal pairs WCK1, WCKB1, WCK2, WCKB2, WCK3, and WCKB3 to the third to eighth ports C3 to C8. The memory controller 110 may control the second to fourth data clock signal pairs WCK1, WCKB1, WCK2, WCKB2, WCK3, and WCKB3 not to be output to the third to eighth ports C3 to C8 of the memory controller 110 by using a control circuit 310.

Referring to FIG. 11, the memory controller 110 may include first to fourth transmitters 1112, 1114, 1116, and 1118. The first transmitter 1112 may output the first data clock signal pair WCK0 and WCKB0, which is generated by the data clock generator 111, to the first and second ports C1 and C2 of the memory controller 110, respectively. The second to fourth transmitters 1114, 1116, and 1118 may be disabled in response to a control signal DISABLE provided by the control circuit 310. Accordingly, the second to fourth data clock signal pairs WCK1, WCKB1, WCK2, WCKB2, WCK3, and WCKB3 generated by the data clock generator 111 may not be output to the third to eighth ports C3 to C8 of the memory controller 110.

Between the first and second ports C1 and C2 of the memory controller 110 and the first to eighth ports M1 to M8 of the memory device 120, the first and second signal lines 1031 and 1032 may be routed. The first data clock signal pair WCK0 and WCKB0 output through the first and second ports C1 and C2 of the memory controller 110 may be input to the first and second ports M1 and M2, the third and fourth ports M3 and M4, the fifth and sixth ports M5 and M6, and the seventh and eighth ports M7, and M8 of the memory device 120 through the first and second signal lines 1031 and 1032.

The memory device 120 may include first to fourth receivers 1122, 1124, 1126, and 1128. The first receiver 1122 may receive the first data clock signal pair WCK0 and WCKB0 that is input to the first and second ports M1 and M2 of the memory device 120, and provide the received first data clock signal pair WCK0 and WCKB0 to the inside of the memory device 120 as a first data clock signal pair WCK0 and WCKB0 correlated with the first data group DQ[0:7]. The second receiver 1124 may receive the first data clock signal pair WCK0 and WCKB0, that is input to the third and fourth ports M3 and M4 of the memory device 120, and provide the received first data clock signal pair WCK0 and WCKB0 to the inside of the memory device 120 as a second data clock signal pair WCK1 and WCKB1 correlated with the second data group DQ[8:15]. The third receiver 1126 may receive the first data clock signal pair WCK0 and WCKB0, that is input to the fifth and sixth ports M5 and M6 of the memory device 120, and provide the received first data clock signal pair WCK0 and WCKB0 to the inside of the memory device 120 as a third data clock signal pair WCK2 and WCKB2 correlated with the third data group DQ[16:23]. The fourth receiver 1128 may receive the first data clock signal pair WCK0 and WCKB0, that is input to the seventh and eighth ports M7 and M8 of the memory device 120, and provide the received first data clock signal pair WCK0 and WCKB0 to the inside of the memory device 120 as a fourth data clock signal pair WCK3 and WCKB3 correlated with the fourth data group DQ[24:31].

In the memory device 120, the first data group DQ[0:7] may be received depending on the first data clock signal pair WCK0 and WCKB0 and then be stored in memory cells of the memory cell array 121 depending on the first data clock signal pair WCK0 and WCKB0. The second data group DQ[8:15] may be received depending on the first data clock signal pair WCK0 and WCKB0 and then be stored in memory cells of the memory cell array 121 depending on the second data clock signal pair WCK1 and WCKB1. The third data group DQ[16:23] may be received depending on the first data clock signal pair WCK0 and WCKB0 and then be stored in memory cells of the memory cell array 121 depending on the third data clock signal pair WCK2 and WCKB2. The fourth data group DQ[24:31] may be received depending on the first data clock signal pair WCK0 and WCKB0 and then be stored in memory cells of the memory cell array 121 depending on the fourth data clock signal pair WCK3 and WCKB3.

The memory controller 110 may control the transmission of the first data group DQ[0:7], the second data group DQ[8:15], the third data group DQ[16:23], and/or the fourth data group DQ[24:31] so that the first data group DQ[0:7] transmitted to the first data bus 1035, the second data group DQ[8:15] transmitted to the second data bus 1036, the third data group DQ[16:23] transmitted to the third data bus 1037, and the fourth data group DQ[24:31] transmitted to the fourth data bus 1038 are synchronized with the first data clock signal pair WCK0 and WCKB0, in consideration of a skew caused by the first and second signal lines 1031 and 1032 through which the first data clock signal pair WCK0 and WCKB0 is transmitted.

The memory system 1000 of FIGS. 10 and 11 may be included in any one of the semiconductor packages 500a, 500b, 600a, 600b, 600c, 700a, and 700b described with reference to FIGS. 5A to 7B. Accordingly, the first data clock signal pair WCK0 and WCKB0 provided from the memory controller 110 to the memory device 120 may be branched at a signal line formed in the lower package substrate 510 of the PoP semiconductor package 500a of FIG. 5A, branched at a signal line formed in the upper package substrate 520 of the PoP semiconductor package 500b of FIG. 5B, branched at a signal line formed in the lower redistribution interposer 612 of the PoP semiconductor package 600a of FIG. 6A, branched at a signal line formed in the upper redistribution interposer 614 of the PoP semiconductor package 600b of FIG. 6B, branched at a signal line formed in the upper package substrate 620 of the PoP semiconductor package 600c of FIG. 6C, branched at a signal line formed in the interposer 710 of the semiconductor package 700a of FIG. 7A, or branched at a signal line formed in the substrate base 754 of the semiconductor package 700b of FIG. 7B.

Figure 12:
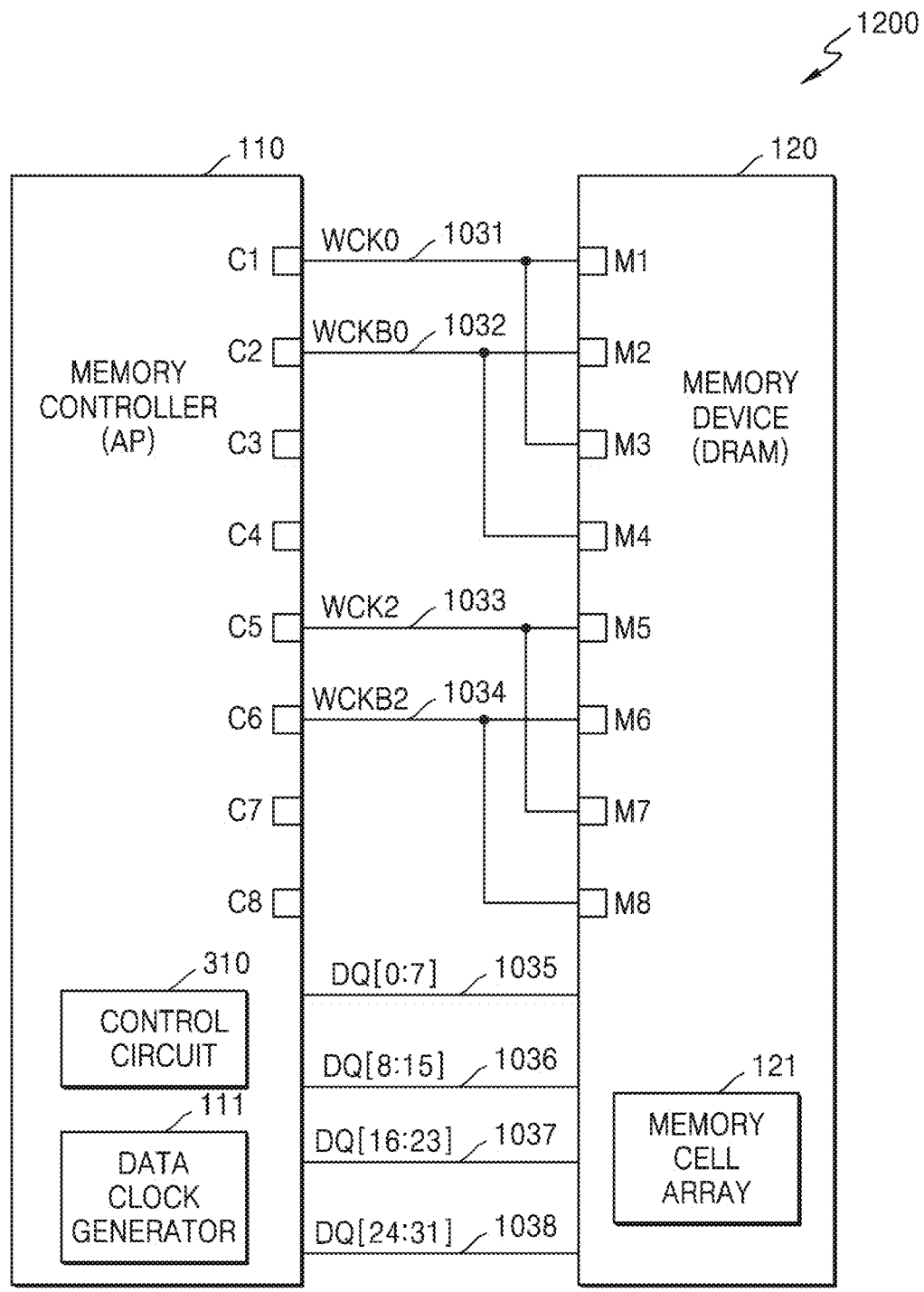
FIGS. 12 and 13 are block diagrams illustrating a memory system according to an example embodiment of the inventive concepts.
Figure 13:
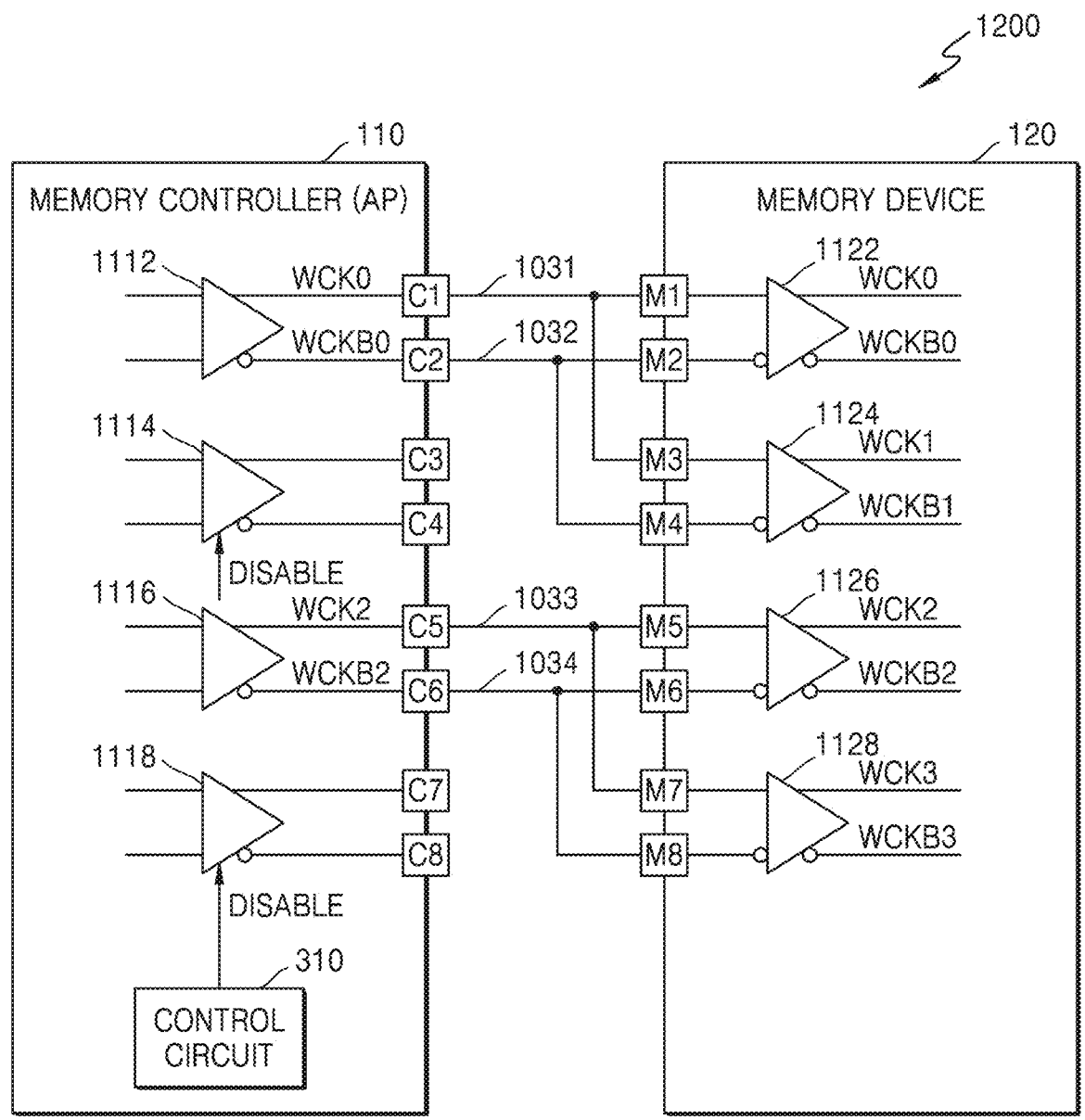

FIGS. 12 and 13 are block diagrams illustrating a memory system 1200 according to an example embodiment of the inventive concepts.

The memory system 1200 of FIGS. 12 and 13 is different from the memory system 1000 of FIGS. 10 and 11 in that a first data clock signal pair WCK0 and WCKB0 output from first and second ports C1 and C2 of a memory controller 110 is provided to first to fourth ports M1 to M4 of a memory device 120 through first and second signal lines 1031 and 1032 and a third data clock signal pair WCK2 and WCKB2 output from fifth and sixth ports C5 and C6 of the memory controller 110 is provided to fifth to eight ports M5 to M8 of the memory device 120 through third and fourth signal lines 1033 and 1034, and the remaining parts of the memory system 1200 are the same as or substantially similar to those of the memory system 1000. Hereinafter, the difference from FIGS. 10 and 11 will be mainly described.

In the memory system 1200, the first data clock signal pair WCK0 and WCKB0 generated by a data clock generator 111 may be output to the first and second signal lines 1031 and 1032 through the first and second ports C1 and C2, and the third data clock signal pair WCK2 and WCKB2 generated by the data clock generator 111 may be output to the third and fourth signal lines 1033 and 1034 through the fifth and sixth ports C5 and C6, while not outputting the second and fourth data clock signal pairs WCK1, WCKB1, WCK3, and WCKB3 to the third and fourth ports C3 and C4 and the seventh and eighth ports C7 and C8. The memory controller 110 may control the second and fourth data clock signal pairs WCK1, WCKB1, WCK3, and WCKB3 not to be output to the third and fourth ports C3 and C4 and the seventh and eighth ports C7 and C8 of the memory controller 110.

In the memory controller 110, a first transmitter 1112 may output the first data clock signal pair WCK0 and WCKB0 generated by the data clock generator 111 to the first and second ports C1 and C2 of the memory controller 110, and a third transmitter 1116 may output the third data clock signal pair WCK2 and WCKB2 generated by the data clock generator 111 to the fifth and sixth ports C5 and C6 of the memory controller 110. Second and fourth transmitters 1114 and 1118 may be disabled in response to a control signal DISABLE provided by a control circuit 310 such that the second and fourth data clock signal pairs WCK1, WCKB1, WCK3, and WCKB3 generated by the data clock generator 111 are not output to the third and fourth ports C3 and C4 and the seventh and eighth ports C7 and C8 of the memory controller 110.

In the memory device 120, a first receiver 1122 may receive the first data clock signal pair WCK0 and WCKB0 input to the first and second ports M1 and M2 of the memory device 120 and provide the received first data clock signal pair WCK0 and WCKB0 to the inside of the memory device 120 as a first data clock signal pair WCK0 and WCKB0 correlated with a first data group DQ [0:7]. A second receiver 1124 may receive the first data clock signal pair WCK0 and WCKB0 input to the third and fourth ports M3 and M4 of the memory device 120 and provide the received first data clock signal pair WCK0 and WCKB0 to the inside of the memory device 120 as a second data clock signal pair WCK1 and WCKB1 correlated with a second data group DQ [8:15]. A third receiver 1126 may receive the third data clock signal pair WCK2 and WCKB2 input to the fifth and sixth ports M5 and M6 of the memory device 120 and provide the received third data clock signal pair WCK2 and WCKB2 to the inside of the memory device 120 as a third data clock signal pair WCK2 and WCKB2 correlated with a third data group DQ [16:23]. A fourth receiver 1128 may receive the third data clock signal pair WCK2 and WCKB2 input to the seventh and eighth ports M7 and M8 of the memory device 120 and provide the received third data clock signal pair WCK2 and WCKB2 to the inside of the memory device 120 as a fourth data clock signal pair WCK3 and WCKB3 correlated with a fourth data group DQ [24:31].

The memory system 1200 of FIGS. 12 and 13 may be included in any one of the semiconductor packages 500a, 500b, 600a, 600b, 600c, 700a, and 700b described with reference to FIGS. 5A to 7B. Accordingly, the first data clock signal pair WCK0 and WCKB0 and the third data clock signal pair WCK2 and WCKB2, provided from the memory controller 110 to the memory device 120, may be branched at signal lines formed in the lower package substrate 510 of the PoP semiconductor package 500a of FIG. 5A, branched at signal lines formed in the upper package substrate 520 of the PoP semiconductor package 500b of FIG. 5B, branched at signal lines formed in the lower redistribution interposer 612 of the PoP semiconductor package 600a of FIG. 6A, branched at signal lines formed in the upper redistribution interposer 614 of the PoP semiconductor package 600b of FIG. 6B, branched at signal lines formed in the upper package substrate 620 of the PoP semiconductor package 600c of FIG. 6C, branched at signal lines formed in the interposer 710 of the semiconductor package 700a of FIG. 7A, or branched at signal lines formed in the substrate base 754 of the semiconductor package 700b of FIG. 7B.

Figure 14:
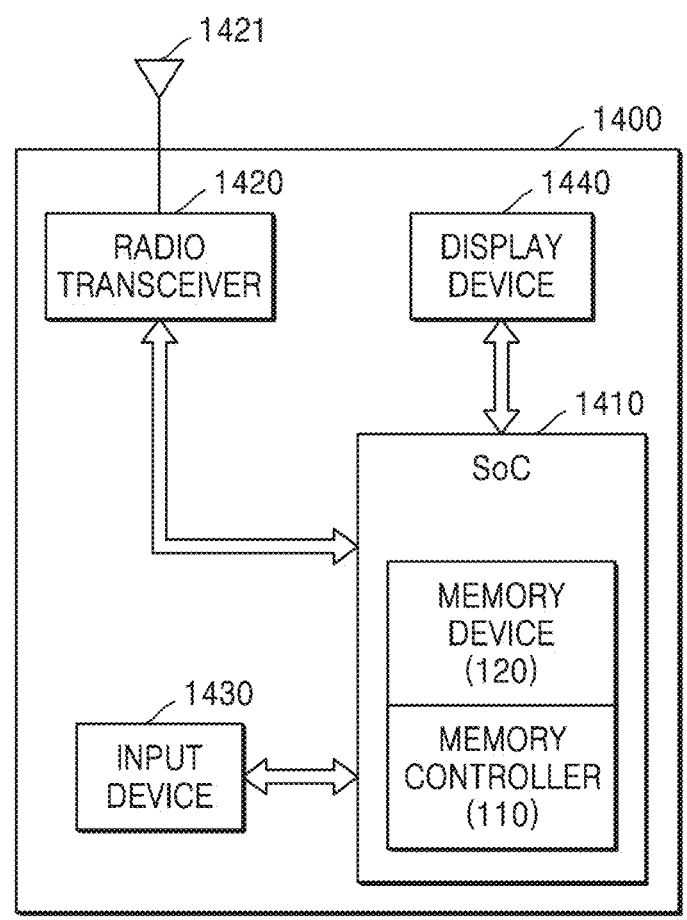
FIG. 14 is a block diagram illustrating an application example of the inventive concepts applied to a mobile electronic device.

FIG. 14 is a block diagram illustrating an application example of the inventive concepts applied to a mobile electronic device 1400.

Referring to FIG. 14, the mobile electronic device 1400 may be a device having a wireless Internet capabilities, for example, a cellular phone, a smart phone, or a tablet PC. The mobile electronic device 1400 may include a system on chip (SoC) 1410. The SoC 1410 may be made in the form of a package-on-chip (PoP). The SoC 1410 may include a memory controller 110 such as an application processor (AP) and a memory device 120 (e.g., a wide input/output (IO) memory or LPDDRx memory). The LPDDRx memory refers to low power double data rate (DDR) SDRAM, where x is a natural number that is equal to or greater than 3. The SoC 1410 may be implemented using the example embodiments shown in FIGS. 1 to 13.

A radio transceiver 1420 may transmit and receive radio signals through an antenna 1421. For example, the radio transceiver 1420 may convert radio signals received via the antenna 1421 into signals which the SoC 1410 may process. The SoC 1410 may process signals received from the radio transceiver 1420 at the memory controller 110, and may store data obtained by processing the signals in the memory device 120, or may display the data through a display device 1430. The radio transceiver 1420 may convert signals output from the SoC 1410 into radio signals, and output the radio signals to the outside via the antenna 1421.

An input device 1440 may be a device that is configured to input signals for controlling the operation of the SoC 1410 or data to be processed by the SoC 1410, and may be implemented as a touch pad, a pointing device such as a computer mouse, a keypad, or a keyboard. The SoC 1410 may control the display device 1430 so that data output from the memory device 120, radio signals output from the radio transceiver 1420, and/or data output from the input device 1440 may be displayed through the display device 1430.

According to some example embodiments of the inventive concepts, the number of data clock signals output from the AP may be reduced within a range that does not hinder the operation speed of a mobile electronic device by disabling some data clock signals that are not desired to be output. Thus, power consumption of the mobile electronic device may be reduced.

While the inventive concepts have been particularly shown and described with reference to some example embodiments thereof, it will be understood that various changes in form and details may be made therein without departing from the spirit and scope of the following claims.

What is claimed is:

1. A semiconductor package, comprising:
a first data clock signal line branching into n lines where n is an integer greater than or equal to 2, the n lines configured to carry a first data clock signal from a memory controller to a memory device;
a first data bus configured to transmit data of a first data group;
a second data bus configured to transmit data of a second data group; and
the memory device coupled to the first data clock signal line and the first and the second data buses,
wherein the memory device includes,
first data pads being connected to the first data bus,
second data pads being connected to the second data bus,
a first clock pad being connected to one of the n lines of the first data clock signal line, the first clock pad being configured to receive the first data clock signal and the first data pads being configured to receive the data of the first data group based on the first clock pad receiving the first data clock signal, and
a second clock pad being connected to another one of the n lines of the first data clock signal line, the second clock pad being configured to receive the first data clock signal and the second data pads being configured to receive the data of the second data group based on the second clock pad receiving the first data clock signal.

2. The semiconductor package of claim 1, further comprising:
a complementary first data clock signal line being connected to the memory device and being configured to transmit a complementary first data clock signal, the complementary first data clock signal having a complementary phase with regard to a phase of the first data clock signal.

3. The semiconductor package of claim 1, wherein the memory device further includes a plurality of channels interfacing with the memory controller, the first data group and the second data group being included one channel among the plurality of channels.

4. The semiconductor package of claim 3, further comprising:

a third data bus configured to transmit data of a third data group; and
a fourth data bus configured to transmit data of a fourth data group,
wherein the memory device further includes,
third data pads being connected to the third data bus,
fourth data pads being connected to the fourth data bus,
a third clock pad being connected to still another one of the n lines of the first data clock signal line, the third clock pad being configured to receive the first data clock signal and the third data pads being configured to receive the data of the third data group based on the third clock pad receiving the first data clock signal, and
a fourth clock pad being connected to yet another one of the n lines of the first data clock signal line, the fourth clock pad being configured to receive the first data clock signal and the fourth data pads being configured to receive the data of the fourth data group based on the fourth clock pad receiving the first data clock signal.

5. The semiconductor package of claim 4, wherein the third data group and the fourth data group are included in the one channel among the plurality of channels.

6. The semiconductor package of claim 1, wherein the first data clock signal line is arranged and branched in a substrate of the semiconductor package.

7. The semiconductor package of claim 1, wherein the first data clock signal line is arranged and branched in an interposer of the semiconductor package.

8. The semiconductor package of claim 1, wherein the memory device comprises wide input/output (IO) memory, Low-Power Double Data Rate (LPDDR) Synchronous Dynamic Random Access Memory (SDRAM), or high bandwidth memory (HBM).

9. The semiconductor package of claim 1, wherein each of the data of the first and the second data groups includes 8 bits.

10. A semiconductor package, comprising:
a first data clock signal line configured to transmit a first data clock signal, the first data clock signal being received from the outside of the semiconductor package and the first data clock signal line being branched into n lines, where n is an integer greater than or equal to 2;
a second data clock signal line configured to transmit a second data clock signal, the second data clock signal being received from the outside of the semiconductor package and the second data clock signal line being branched into m lines where m is an integer greater than or equal to 2;
a first data bus configured to transmit data of a first data group;
a second data bus configured to transmit data of a second data group;
a third data bus configured to transmit data of a third data group;
a fourth data bus configured to transmit data of a fourth data group; and
a memory device coupled to the first and second data clock signal lines and the first through the fourth data buses,
wherein the memory device includes,
first data pads being connected to the first data bus,
second data pads being connected to the second data bus,
third data pads being connected to the third data bus,
fourth data pads being connected to the fourth data bus,
a first clock pad being connected to the first data clock signal line, the first clock pad being configured to receive the first data clock signal and the first data pads being configured to receive the data of the first data group based on the first clock pad receiving the first data clock signal,
a second clock pad being connected to the first data clock signal line, the second clock pad being configured to receive the first data clock signal and the second data pads being configured to receive the data of the second data group based on the second clock pad receiving the first data clock signal,
a third clock pad being connected to the second data clock signal line, the third clock pad being configured to receive the second data clock signal and the third data pads being configured to receive the data of the third data group based on the third clock pad receiving the second data clock signal, and
a fourth clock pad being connected to the second data clock signal line, the fourth clock pad being configured to receive the second data clock signal and the fourth data pads being configured to receive the data of the fourth data group based on the fourth clock pad receiving the second data clock signal.

11. The semiconductor package of claim 10, further comprising:
a complementary first data clock signal line configured to transmit a complementary first data clock signal, the complementary first data clock signal having a first complementary phase with regard to a phase of the first data clock signal; and
a complementary second data clock signal line configured to transmit a complementary second data clock signal, the complementary second data clock signal having a second complementary phase with regard to a phase of the second data clock signal.

12. The semiconductor package of claim 10, wherein the memory device further includes a plurality of channels for interfacing with an exterior of the semiconductor package, the first through the fourth data groups comprising one channel among the plurality of channels.

13. The semiconductor package of claim 10, wherein the first and the second data clock signal lines are arranged and branched in a substrate of the semiconductor package.

14. The semiconductor package of claim 10, wherein the first and the second data clock signal lines are arranged and branched in an interposer of the semiconductor package.

15. The semiconductor package of claim 10, wherein the memory device comprises wide IO memory, LPDDR SDRAM, or HBM.

16. The semiconductor package of claim 10, wherein each of the data of the first through the fourth data groups includes 8 bits.

17. A mobile electronic device, comprising:
a memory device; and
a memory controller configured to transmit a first data clock signal to the memory device,
wherein the memory device includes,
a first data clock signal line branching into n lines where n is an integer greater than or equal to 2, the n lines configured to carry the first data clock signal to the memory device,
first data pads configured to transmit and receive data of a first data group,
second data pads configured to transmit and receive data of a second data group, a first clock pad being connected to one of the n lines of the first data clock signal line, the first clock pad configured to receive the first data clock signal and the first data pads being configured to receive the data of the first data group based on the first clock pad receiving the first data clock signal, and a second clock pad being connected to another one of the n lines of the first data clock signal line, the second clock pad configured to receive the first data clock signal and the second data pads being configured to receive the data of the second data group based on the second clock pad receiving the first data clock signal.

18. The mobile electronic device of claim 17, wherein the memory controller is configured to transmit a complementary first data clock signal, the complementary first data clock signal having a complementary phase with regard to a phase of the first data clock signal.

19. The mobile electronic device of claim 17, wherein the memory device further includes, third data pads configured to transmit and receiving data of a third data group, fourth data pads configured to transmit and receiving data of a fourth data group, a third clock pad being connected to still another one of the n lines of the first data clock signal line, the third clock pad configured to receive the first data clock signal and the third data pads being configured to receive the data of the third data group based on the third clock pad receiving the first data clock signal, and a fourth clock pad being connected to yet another one of the n lines of the first data clock signal line, the fourth clock pad configured to receive the first data clock signal and the fourth data pads being configured to receive the data of the fourth data group based on the fourth clock pad receiving the first data clock signal.

20. The mobile electronic device of claim 17, wherein the memory device further includes LPDDR SDRAM.

* * * * *